United States Patent
Cho et al.

(10) Patent No.: US 12,243,969 B2
(45) Date of Patent: Mar. 4, 2025

(54) LIGHT EMITTING DEVICE STRUCTURE AND METHOD FOR MANUFACTURING SAME

(71) Applicant: Samsung Display Co., LTD., Yongin-si (KR)

(72) Inventors: Hyun Min Cho, Seoul (KR); Jung Hong Min, Pyeongtaek-si (KR); Dae Hyun Kim, Hwaseong-si (KR); Dong Uk Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 507 days.

(21) Appl. No.: 17/291,398

(22) PCT Filed: May 27, 2019

(86) PCT No.: PCT/KR2019/006327
§ 371 (c)(1),
(2) Date: May 5, 2021

(87) PCT Pub. No.: WO2020/096150
PCT Pub. Date: May 14, 2020

(65) Prior Publication Data
US 2022/0005991 A1 Jan. 6, 2022

(30) Foreign Application Priority Data
Nov. 6, 2018 (KR) .................. 10-2018-0135067

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/005* (2013.01); *H01L 33/16* (2013.01);
(Continued)

(58) Field of Classification Search
CPC .. H01L 2924/1431; H01L 33/38; H01L 33/12
See application file for complete search history.

(56) References Cited

U.S. PATENT DOCUMENTS 8,592,839 B2 11/2013 Jeong et al.
8,871,544 B2 10/2014 Jeong et al.
(Continued)

FOREIGN PATENT DOCUMENTS

JP 2002-344055 11/2002
JP 2007-519214 7/2007
(Continued)

OTHER PUBLICATIONS

Extended European Search Report for European Application No./Patent No. 19881430.3, dated Jul. 1, 2022.
(Continued)

*Primary Examiner* — Evren Seven
(74) *Attorney, Agent, or Firm* — KILE PARK REED & HOUTTEMAN PLLC

(57) ABSTRACT

A light emitting element structure may include at least one light emitting element which is disposed on a substrate and spaced apart from each other, and extends in a direction perpendicular to the substrate; an auxiliary layer which is disposed on the substrate, exposes at least a portion of the upper surface of the substrate, and surrounds the outer surface of the light emitting element; a current spreading layer which is disposed on the auxiliary layer and electrically contacts an end of the light emitting element; a first pad which is electrically connected to the end of the light
(Continued)

emitting element, disposed on the current spreading layer, and does not to overlap the light emitting element; and a second pad which is electrically connected to another end of the light emitting element disposed on the upper surface of the exposed substrate and spaced apart from the auxiliary layer.

21 Claims, 29 Drawing Sheets

(51) Int. Cl.
  *H01L 33/00* (2010.01)
  *H01L 33/16* (2010.01)
  *H01L 33/38* (2010.01)
(52) U.S. Cl.
  CPC ...... *H01L 33/38* (2013.01); *H01L 2933/0016* (2013.01); *H01L 2933/0066* (2013.01)

(56) References Cited

U.S. PATENT DOCUMENTS

| | | | |
|---|---|---|---|
| 8,872,214 B2 | 10/2014 | Negishi et al. | |
| 9,112,112 B2* | 8/2015 | Do | H01L 33/08 |
| 10,021,762 B1* | 7/2018 | Tsai | H10K 77/111 |
| 10,615,305 B1* | 4/2020 | Oyer | H01L 27/15 |
| 2005/0139818 A1* | 6/2005 | Lee | H01L 21/02576 |
| | | | 257/E33.005 |
| 2008/0157057 A1 | 7/2008 | Kim | |
| 2011/0272712 A1* | 11/2011 | Jeong | H01L 27/156 |
| | | | 438/22 |
| 2012/0132888 A1* | 5/2012 | Kwak | H01L 33/08 |
| | | | 977/932 |
| 2014/0057381 A1 | 2/2014 | Jeong et al. | |
| 2014/0145237 A1 | 5/2014 | Do et al. | |
| 2019/0013433 A1* | 1/2019 | Kim | H01L 33/0025 |

FOREIGN PATENT DOCUMENTS

| | | |
|---|---|---|
| KR | 10-2004-0008962 | 1/2004 |
| KR | 10-2008-0019912 | 3/2008 |
| KR | 10-2008-0035578 | 4/2008 |
| KR | 10-2011-0123118 | 11/2011 |
| KR | 10-2012-0057298 | 6/2012 |
| KR | 10-2012-0100000 | 9/2012 |
| KR | 10-2012-0122160 | 11/2012 |
| KR | 10-1436123 | 11/2014 |
| KR | 10-2015-0061544 | 6/2015 |
| KR | 10-2015-0113288 | 10/2015 |
| KR | 10-2016-0027431 | 3/2016 |
| KR | 10-2018-0009014 | 1/2018 |

OTHER PUBLICATIONS

International Search Report, with English translation, corresponding to International Application No. PCT/KR2019/006327 dated Sep. 17, 2019.

Written Opinion, with English translation, corresponding to International Application No. PCT/KR2019/006327, dated Sep. 17, 2019.

* cited by examiner

LIGHT EMITTING DEVICE STRUCTURE AND METHOD FOR MANUFACTURING SAME

CROSS-REFERENCE TO RELATED APPLICATION

This application is a national entry of International Application No. PCT/KR2019/006327, filed on May 27, 2019, which claims under 35 U.S.C. §§ 119(a) and 365(b) priority to and benefits of Korean Patent Application No. 10-2018-0135067, filed on Nov. 6, 2018 in the Korean Intellectual Property Office (KIPO), the entire contents of which are incorporated herein by reference.

BACKGROUND

1. Technical Field

The disclosure relates to a light-emitting element structure and a method of manufacturing the same, and more specifically, to a light-emitting element structure for evaluating electrical and optical characteristics of a light-emitting element having a micro-size, and a method of manufacturing the same.

2. Description of the Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an OLED that includes an organic material as a fluorescent material, an inorganic light-emitting diode that includes an inorganic material as a fluorescent material, or the like.

The OLED uses an organic material as a fluorescent material of a light-emitting element, and a manufacturing process thereof is simple. Thus, the OLED has an advantage at least in that a display device has flexible properties. However, it is known that the organic material is vulnerable to a high temperature driving environment and has relatively low blue light efficiency.

On the other hand, since the inorganic light-emitting diode includes an inorganic semiconductor as a fluorescent material, the inorganic light-emitting diode has durability even in a high temperature environment and has high blue light efficiency as compared with the OLED. Even in a manufacturing process pointed out as a limitation of the conventional inorganic light-emitting diode element, a transfer method using a dielectrophoresis (DEP) method has been developed. Accordingly, research has been continuously conducted on an inorganic light-emitting diode having excellent durability and efficiency as compared with an OLED.

SUMMARY

A light-emitting element may be manufactured by growing a semiconductor material on a substrate. The light-emitting element has a micro-size of a micrometer or nanometer unit. When the light-emitting element is manufactured on the substrate, defects or emission defects may occur in the light-emitting element during a manufacturing process. Accordingly, prior to manufacturing a display device using the light-emitting element, it is necessary to evaluate the electrical and optical characteristics of the light-emitting element, but the light-emitting element having a micro-size has a problem in that such measurement is difficult.

Aspects of the disclosure provide a light-emitting element structure which includes a light-emitting element manufactured by growing a semiconductor crystal to evaluate the electrical and optical characteristics of the light-emitting element, and a method of manufacturing the same.

It should be noted that objects of the disclosure are not limited to the above-described objects, and other objects of the disclosure will be apparent to those skilled in the art from the following descriptions.

According to an embodiment of the disclosure, a light-emitting element structure includes at least one light-emitting element which is disposed on a substrate and spaced apart from each other, and extends in a direction perpendicular to the substrate, an auxiliary layer which is disposed on the substrate, exposes at least a portion of an upper surface of the substrate, and surrounds an outer surface of the at least one light-emitting element, a current spreading layer which is disposed on the auxiliary layer and electrically contacts an end of the at least one light-emitting element, a first pad which is electrically connected to the end of the at least one light-emitting element, disposed on the current spreading layer, and does not overlap the at least one light-emitting element, and a second pad which is electrically connected to another end of the at least one light-emitting element, disposed on the at least a portion of the upper surface of the substrate, and spaced apart from the auxiliary layer.

The light-emitting element structure may further include a first area overlapping the at least one light-emitting element, and a second area, wherein the auxiliary layer and the current spreading layer may be disposed in the first area and at least a portion of the second area.

The auxiliary layer may include an insulating material and may be disposed such that the end of the at least one light-emitting element is partially exposed, and the current spreading layer may include a transparent conductive material and may surround the end of the at least one light-emitting element.

The first pad may include a first extension portion and a first electrode line electrically connected to the first extension portion, and the first electrode line may include two ends electrically connected to different side portions of the first extension portion and may be disposed in the second area to surround the first area.

The first extension portion may have a width greater than a width of the first electrode line.

The second pad may have a constant width and may surround an outer periphery of the auxiliary layer.

The at least one light-emitting element may include a semiconductor crystal that extends in a direction, and an insulating film surrounding an outer peripheral surface of the semiconductor crystal.

The semiconductor crystal may include a first conductivity-type semiconductor contacting the substrate, a second conductivity-type semiconductor having a polarity different from a polarity of the first conductivity-type semiconductor, an element active layer disposed between the first conductivity-type semiconductor and the second conductivity-type semiconductor, and an electrode layer disposed on the second conductivity-type semiconductor, and the insulating film may be disposed such that an upper surface of the electrode layer is exposed.

The auxiliary layer may contact an outer surface of the insulating film, the current spreading layer may electrically contact the electrode layer exposed by the insulating film, and the first pad may be electrically connected to the electrode layer through the current spreading layer.

The substrate may include a base substrate and a conductive semiconductor layer disposed on the base substrate, the first conductivity-type semiconductor may electrically contact the conductive semiconductor layer, and the second pad may be disposed on the conductive semiconductor layer and be electrically connected to the first conductivity-type semiconductor.

The at least one light-emitting element may include a first light-emitting element, and a second light-emitting element spaced apart from the first light-emitting element.

The first area may include a first sub-area which overlaps the first light-emitting element, and a second sub-area which overlaps the second light-emitting element and is spaced apart from the first sub-area, and the second area may include a third area disposed between the first-sub area and the second sub-area, and a fourth area disposed at an outer periphery of the first sub-area and the second sub-area.

The first pad may include a second extension portion disposed in the third area, a second electrode line disposed in the fourth area, and at least one connection portion disposed in the third area and electrically connecting the second extension portion and the second electrode line.

The second electrode line may surround the first sub-area and the second sub-area.

The at least one connection portion may be disposed in the third area.

The at least one connection portion may include a first connection portion which extends in a first direction, includes two ends electrically contacting the second electrode line, and includes a central portion overlapping the second extension portion, and a second connection portion which extends in a second direction different from the first direction, electrically contacts the second electrode line, and includes a central portion overlapping the second extension portion, and the first connection portion and the second connection portion may intersect each other at the second extension portion.

According to another embodiment of the disclosure, a method of manufacturing a light-emitting element structure may include preparing a substrate and at least one light-emitting element which is disposed on the substrate and extends in a direction perpendicular to the substrate, forming an auxiliary layer surrounding an outer surface of the at least one light-emitting element on the substrate, forming a current spreading layer disposed on the auxiliary layer and electrically contacting an end of the at least one light-emitting element, forming a first pad disposed on the current spreading layer and electrically connected to the end of the at least one light-emitting element, and forming a second pad disposed on the substrate to surround an outer periphery of the auxiliary layer and electrically connected to another end of the at least one light-emitting element.

The auxiliary layer may include an insulating material and may be disposed such that the end of the at least one light-emitting element is partially exposed, the current spreading layer may include a transparent conductive material and may surround the end of the at least one light-emitting element, and the first pad may be electrically connected to the end of the at least one light-emitting element through the current spreading layer.

The forming of the first pad may include forming an extension portion and an electrode line electrically connected to the extension portion, the extension portion may not overlap the at least one light-emitting element, and the electrode line may surround an area overlapping the at least one light-emitting element.

The substrate may include a base substrate and a conductive semiconductor layer disposed on the base substrate, and the forming of the second pad may include forming the second pad on the conductive semiconductor layer and to be electrically connected to the other end of the light-emitting element.

Other details of embodiments for solving the above problems are included in the detailed description and the drawings.

A light-emitting element structure according to one embodiment may include a light-emitting element and may include a plurality of pads disposed to not overlap the light-emitting element. The plurality of pads can be connected to an external power source and can be electrically connected to both ends of the light-emitting element so that the light-emitting element structure can measure the electrical and optical characteristics of the light-emitting element.

Accordingly, the light-emitting element structure is positioned such that the plurality of pads does not overlap the light-emitting element, thereby preventing the blocking of light emitted from the light-emitting element to accurately measure the electrical or optical characteristics.

Effects of the disclosure are not limited to the embodiments set forth herein and more diverse effects are included in this specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as being limited to the embodiments set forth herein. Rather, these embodiments are provided so that this disclosure will be more thorough and complete, and will convey the scope of the disclosure to those skilled in the art.

It will also be understood that when a layer is referred to as being "on" another layer or substrate, it can be directly on the other layer or substrate, or one or more intervening layers may also be present. The same reference numbers indicate the same components throughout the specification.

It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the disclosure, if an element is "connected to" or "contacts" another element, the two elements may be physically and/or electrically connected to each other or may be integral with each other unless the context indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
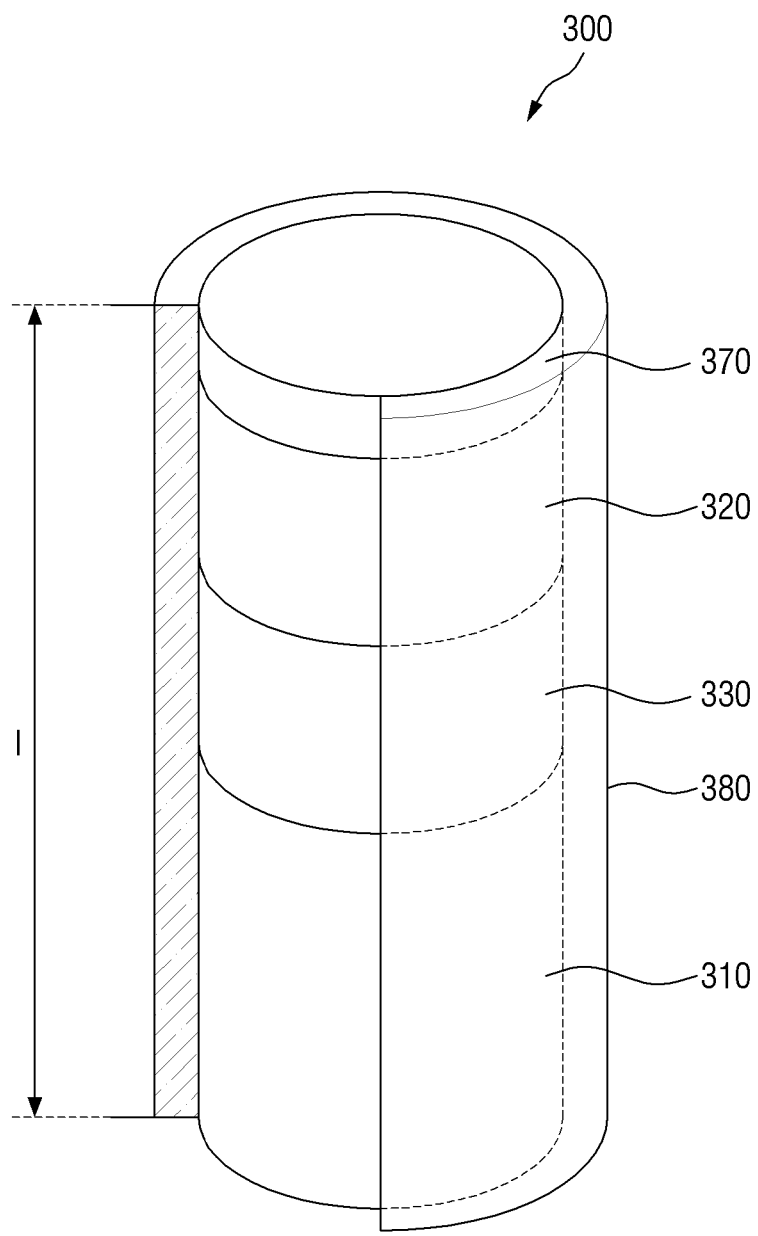
FIG. 1 is a schematic perspective view of a light-emitting element according to an embodiment.

FIG. 1 is a schematic perspective view of a light-emitting element according to an embodiment.

A light-emitting element (or light-emitting diode) 300 may include a semiconductor crystal doped with arbitrary conductivity-type (for example, p-type or n-type) impurities. The semiconductor crystal may receive an electrical signal applied from an external power source and emit light having a specific wavelength in response to the received electrical signal. A display device 10 (see FIG. 28) described below may include light-emitting elements 300 in each pixel PX (see FIG. 28) to display the light emitted by the light-emitting element 300.

The light-emitting element 300 may be a light-emitting diode, and specifically, the light-emitting element 300 may be an inorganic light-emitting diode which has a size in a range of a micrometer to a nanometer scale and is made of an inorganic material. In case that the light-emitting element 300 is an inorganic light-emitting diode and an emission material having an inorganic crystal structure is disposed between two electrodes facing each other and an electric field is formed in a specific direction, the inorganic light-emitting diode may be aligned between the two electrodes in which a polarity is formed therebetween. For example, by forming an electric field, the light-emitting elements 300 having a micro-size may be aligned on electrodes of the display device 10. The light-emitting elements 300 aligned on the electrodes of the display device 10 may receive a predetermined electrical signal from the electrode to emit light having a specific wavelength.

Referring to FIG. 1, the light-emitting element 300 according to an embodiment may include conductivity-type semiconductors 310 and 320, an element active layer 330, an electrode layer 370, and an insulating film 380. The conductivity-type semiconductors 310 and 320 may transmit electrical signals transmitted to the light-emitting element 300 to the element active layer 330, and the element active layer 330 may emit light having a specific wavelength.

The light-emitting element 300 may include a first conductivity-type semiconductor 310, a second conductivity-type semiconductor 320, the element active layer 330 disposed between the first conductivity-type semiconductor 310 and the second conductivity-type semiconductor 320, the electrode layer 370 disposed on the second conductivity-type semiconductor 320, and the insulating film 380 disposed to surround outer surfaces of the first and second conductivity-type semiconductors 310 and 320, the element active layer 330, and the electrode layer 370. FIG. 1 illustrates that the light-emitting element 300 has a structure in which the first conductivity-type semiconductor 310, the element active layer 330, the second conductivity-type semiconductor 320, and the electrode layer 370 are sequentially formed in a length direction thereof, but the disclosure is not limited thereto. The electrode layer 370 may be omitted, and in some embodiments, the electrode layer 370 may be disposed on at least one of both side surfaces of the first conductivity-type semiconductor 310 and the second conductivity-type semiconductor 320. Hereinafter, described are embodiments of the light-emitting element 300 of FIG. 1. The light-emitting element is not limited to the light-emitting element 300 described below. The light-emitting element of this disclosure may include other elements or structure than those of the light-emitting element 300 described below.

The first conductivity-type semiconductor 310 may be an n-type semiconductor layer. As an example, in case that the light-emitting element 300 emits light having a blue wavelength, the first conductivity-type semiconductor 310 may be made of a semiconductor material having a formula of $In_xAl_yGa_{1-x-y}N$ ($0 \leq x \leq 1$, $0 \leq y \leq 1$, and $0 \leq x+y \leq 1$). For example, the first conductivity-type semiconductor 310 may be made of at least one selected from among InAlGaN, GaN, AlGaN, InGaN, AlN, and InN which are doped with an n-type dopant. The first conductivity-type semiconductor 310 may be doped with a first conductivity-type dopant. As an example, the first conductivity-type dopant may be silicon (Si), germanium (Ge), tin (Sn), or the like. The first conductivity-type semiconductor 310 may have a length ranging from about 1.5 μm to about 5 μm, but the disclosure is not limited thereto.

The second conductivity-type semiconductor 320 may be a p-type semiconductor layer. As an example, in case that the light-emitting element 300 emits light having a blue wavelength, the second conductivity-type semiconductor 320 may be made of a semiconductor material having a formula of $In_xAl_yGa_{1-x-y}N$ ($0 \leq x \leq 1$, $0 \leq y \leq 1$, and $0 \leq x+y \leq 1$). For example, the second conductivity-type semiconductor 320 may be made of at least one selected from among InAlGaN, GaN, AlGaN, InGaN, AlN, and InN which are doped with a p-type dopant. The second conductivity-type semiconductor 320 may be doped with a second conductivity-type dopant. As an example, the second conductivity-type dopant may be magnesium (Mg), zinc (Zn), calcium (Ca), selenium (Se), barium (Ba), or the like. The second conductivity-type semiconductor 320 may have a length ranging from about 0.08 μm to about 0.25 μm, but the disclosure is not limited thereto.

In the drawing, each of the first conductivity-type semiconductor 310 and the second conductivity-type semiconductor 320 is illustrated as consisting of a layer, but the disclosure is not limited thereto. In some embodiments, the first conductivity-type semiconductor 310 and the second conductivity-type semiconductor 320 may include more layers according to a material of the element active layer 330 described below.

The element active layer 330 may be disposed between the first conductivity-type semiconductor 310 and the second conductivity-type semiconductor 320 and may include a material having a single or multi-quantum well structure. In case that the element active layer 330 includes a material having a multi-quantum well structure, the element active layer 330 may have a structure in which quantum layers and well layers are alternately stacked. The element active layer 330 may emit light by the coupling of electron-hole pairs according to an electrical signal applied through the first conductivity-type semiconductor 310 and the second conductivity-type semiconductor 320. As an example, in case that the element active layer 330 emits light having a blue wavelength, the element active layer 330 may include a material such as AlGaN or AlInGaN. In particular, in case that the element active layer 330 has a structure in which quantum layers and well layers are alternately stacked in a multi-quantum well structure, the quantum layer may include a material such as AlGaN or AlInGaN, and the well layer may include a material such as GaN or AlGaN.

However, the disclosure is not limited thereto, and the element active layer 330 may have a structure in which a semiconductor material having a high band gap energy and a semiconductor material having a low band gap energy are alternately stacked or may include other Group III to V semiconductor materials according to a wavelength of emitted light. Accordingly, light emitted from the element active layer 330 is not limited to light having a blue wavelength, and in some embodiments, the element active layer 330 may emit light having a red or green wavelength. The element active layer 330 may have a length ranging from about 0.05 μm to about 0.25 μm, but the disclosure is not limited thereto.

Light emitted from the element active layer 330 may be emitted not only to an outer surface of the light-emitting element 300 in the length direction thereof but also to both side surfaces of the light-emitting element 300. The directionality of the light emitted from the element active layer 330 is not limited to a direction.

The electrode layer 370 may be an ohmic contact electrode. However, the present disclosure is not limited thereto, and the electrode layer 370 may be a Schottky contact electrode. The electrode layer 370 may include a conductive metal. For example, the electrode layer 370 may include at least one of among aluminum (Al), titanium (Ti), indium (In), gold (Au), silver (Ag), indium tin oxide (ITO), indium zinc oxide (IZO), and indium tin zinc oxide (ITZO). The electrode layer 370 may include the same material or different materials, but the disclosure is not limited thereto.

The insulating film 380 may be formed to contact and surround the outer surfaces of the first conductivity-type semiconductor 310, the second conductivity-type semiconductor 320, the element active layer 330, and the electrode layer 370. The insulating film 380 may perform a function of protecting such members (e.g., the first conductivity-type semiconductor 310, the second conductivity-type semiconductor 320, the element active layer 330, and the electrode layer 370). As an example, the insulating film 380 may be formed to surround side surfaces of the members (e.g., first conductivity-type semiconductor 310, the second conductivity-type semiconductor 320, the element active layer 330, and the electrode layer 370) and may be formed to expose both ends of the light-emitting element 300 in the length direction, for example, the both ends at which the first conductivity-type semiconductor 310 and the electrode layer 370 are provided. However, the disclosure is not limited thereto.

The insulating film 380 may include at least one selected from among materials having insulating properties, for example, silicon oxide ($SiO_x$), silicon nitride ($SiN_x$), silicon oxynitride ($SiO_xN_y$), and aluminum nitride (AlN), and aluminum oxide ($Al_2O_3$). Accordingly, it is possible to prevent an electrical short circuit that may occur in case that the element active layer 330 directly contacts an electrode through which an electrical signal is transmitted to the light-emitting element 300. Since the insulating film 380 protects the outer surface of the light-emitting element 300 including the element active layer 330, it is possible to prevent a decrease in luminous efficiency.

In the drawing, the insulating film 380 is illustrated as being formed to extend in the length direction of the light-emitting element 300 and to cover or overlap the first conductivity-type semiconductor 310, the second conductivity-type semiconductor 320, the element active layer 330, and the electrode layer 370, but the disclosure is not limited thereto. The insulating film 380 may cover only the first conductivity-type semiconductor 310, element active layer 330, and second conductivity-type semiconductor 320 or cover a portion of the outer surface of the electrode layer 370 so that a portion of the outer surface of the electrode layer 370 may be exposed.

The insulating film 380 may have a thickness ranging from about 0.5 μm to about 1.5 μm, but the disclosure is not limited thereto.

In some embodiments, an outer surface of the insulating film 380 may be surface-treated. The light-emitting element 300 may be aligned between electrodes of the display device 10 (see FIG. 28) described below and may receive an electrical signal from the electrode to emit light. The light-emitting element 300 may be aligned by being sprayed on an electrode in a state of being dispersed in ink. Here, in order for the light-emitting element 300 to remain dispersed without aggregating with other adjacent light-emitting elements 300 in the ink, the surface of the insulating film 380 may be hydrophobically or hydrophilically treated.

The light-emitting element 300 may have a shape extending in a direction. The light-emitting-element 300 may have a shape such as a nanorod, nanowire, or nanotube. In an embodiment, the light-emitting element 300 may have a cylindrical shape or a rod-like shape. However, the shape of the light-emitting element 300 is not limited thereto, and the light-emitting element 300 may have various shapes such as a regular hexahedron, a rectangular parallelepiped, and a hexagonal prism.

A length 1 of the light-emitting element 300 may range from about 1 μm to about 10 μm or from about 2 μm to about 5 μm and may be about 4 μm. The light-emitting element 300 may have a diameter ranging from about 300 nm to about 700 nm, and the light-emitting elements 300 included in the display device 10 may have different diameters according to a difference in composition of the element active layer 330. The light-emitting element 300 may have a diameter of about 500 nm.

The light-emitting element 300 may be manufactured on a substrate by an epitaxial growth method. A seed crystal layer for forming a semiconductor layer may be formed on the substrate, and a desired semiconductor material may be deposited to grow the semiconductor layer. In case that the light-emitting element 300 is grown by an epitaxial method, in some of the light-emitting elements 300, a semiconductor crystal may not smoothly grow, or defects may be partially formed. As described above, the light-emitting element 300 may include a semiconductor crystal having a small size in a range of a micrometer to a nanometer scale. The light-emitting element 300 having a small size has a limitation in directly checking whether the defects are formed.

A light-emitting element structure 1000 according to an embodiment may include one or more light-emitting elements 300 and pads electrically connected to the light-emitting element 300 so that the electrical or optical characteristics of the light-emitting element 300 may be measured. The light-emitting element structure 1000 may evaluate defects or emission defects in the light-emitting element 300 before the light-emitting element 300 is disposed in the display device 10. The light-emitting element structure 1000 may measure the electrical or optical characteristics of the light-emitting element 300 to improve the characteristics of the light-emitting element 300.

Figure 2:
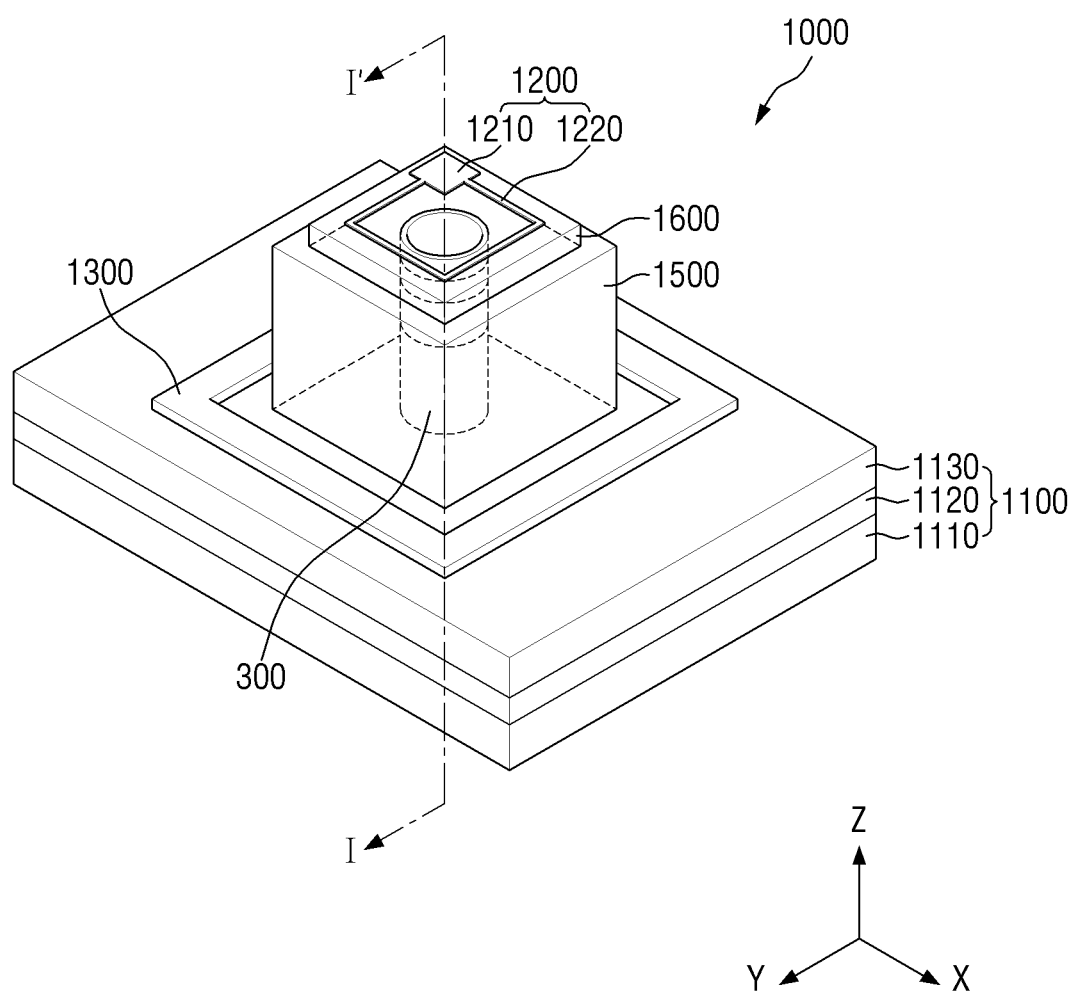
FIG. 2 is a schematic perspective view illustrating a light-emitting element structure according to an embodiment.
Figure 3:
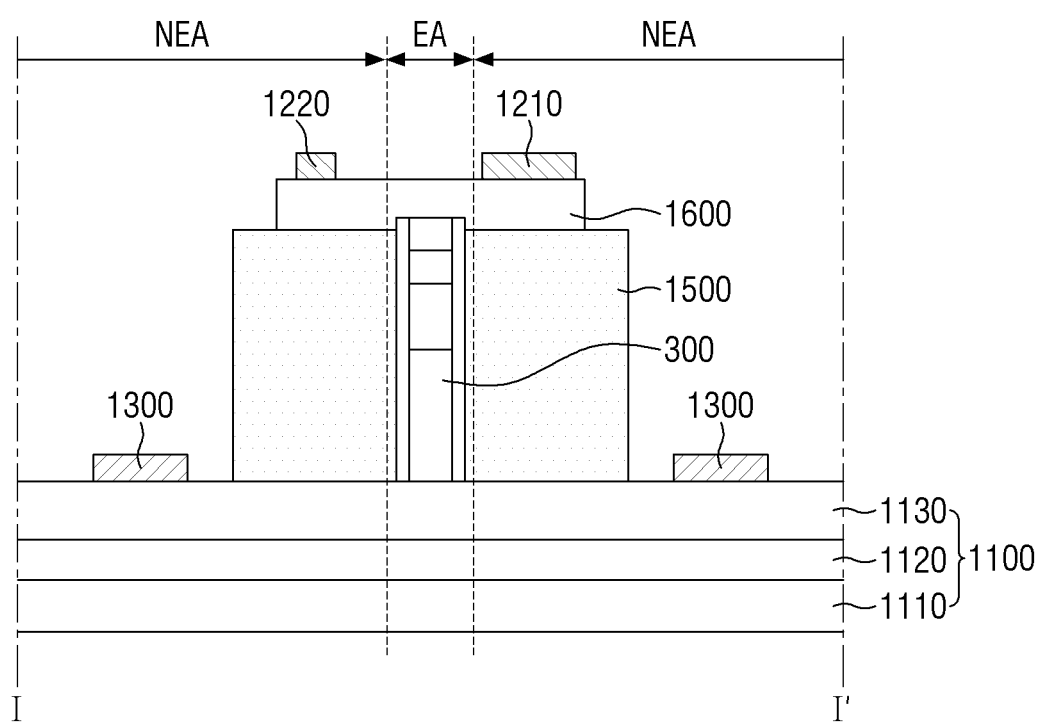
FIG. 3 is a schematic cross-sectional view taken along line I-I' of FIG. 2.

FIG. 2 is a schematic perspective view illustrating a light-emitting element structure according to an embodiment. FIG. 3 is a schematic cross-sectional view taken along line I-I' of FIG. 2.

Referring to FIGS. 2 and 3, a light-emitting element structure 1000 may include a lower substrate 1100, a light-emitting element 300, an auxiliary layer 1500, a current spreading layer 1600, and pads 1200 and 1300.

In the specification, the terms "above," "upper portion," "top," and "upper surface" relates to a Z-axis direction, and the terms "below," "lower portion," "bottom," and "lower surface" relates to a direction opposite to the Z-axis direction. The terms "left," "right," "upper," and "lower" refer to directions when the light-emitting element structure 1000 is viewed in a plan view. For example, in a plan view, the term "right" refers to an X-axis direction, the term "left" refers to a direction opposite to the X-axis direction, the term "lower" refers to a Y-axis direction, and the term "upper" refers to a direction opposite to the Y-axis direction.

The lower substrate 1100 may support the members of the light-emitting element structure 1000 (e.g., lower substrate 1100, the light-emitting element 300, the auxiliary layer 1500, the current spreading layer 1600, and the pads 1200 and 1300). The light-emitting element 300, the auxiliary layer 1500, and a second pad 1300, lower surfaces of which contact the lower substrate 1100, may be disposed on the lower substrate 1100. The current spreading layer 1600 and a first pad 1200 may be disposed on the auxiliary layer 1500. In the drawing, a light-emitting element 300, and the auxiliary layer 1500 and the second pad 1300 surrounding the light-emitting element 300 are illustrated as being disposed on the lower substrate 1100. However, the disclosure is not limited thereto. In some embodiments, more light-emitting elements 300 may be provided, and other members may be further provided.

The lower substrate 1100 may have a quadrangular shape in a plan view and may have a hexahedral shape having a predetermined thickness. As shown in the drawing, the lower substrate 1100 may have a quadrangular planar shape with sides extending in a first direction (for example, an X-axis direction) and a second direction (for example, a Y-axis direction). The lower substrate 1100 may have a predetermined thickness in a third direction (for example, a Z-axis direction). However, the disclosure is not limited thereto. In some embodiments, the sides may be rounded at a predetermined curvature at a point at which the sides in the first direction and the second direction meet. Furthermore, the planar shape of the lower substrate 1100 is not limited to a quadrangular shape and may be formed in another polygonal shape, circular shape, or elliptical shape. As an example, the shape of the lower substrate 1100 may be a circular shape in a plan view and may be a cylinder having a predetermined thickness.

In an embodiment, the lower substrate 1100 may have a structure in which a base substrate 1110, a buffer layer 1120, and a sub-semiconductor layer 1130 are stacked.

The base substrate 1110 may include a sapphire ($Al_2O_3$) substrate and a transparent substrate such as a glass substrate. However, the disclosure is not limited thereto, and the base substrate 1110 may be formed as a conductive substrate such as a GaN, SiC, ZnO, Si, GaP, or GaAs substrate. A thickness of the base substrate 1110 is not particularly limited, but as an example, the base substrate 1110 may have a thickness ranging from about 400 μm to about 1,500 μm.

The buffer layer 1120 may be disposed on the base substrate 1110. In the drawing, a buffer layer 1120 is illustrated as being stacked as a single layer, but the disclosure is not limited thereto, multiple buffer layers may be formed. The buffer layer 1120 may be disposed to reduce a difference in lattice constant between the sub-semiconductor layer 1130 and the base substrate 1110. As described below, the buffer layer 1120 may reduce the difference in lattice constant with the base substrate 1110 such that a crystal of the sub-semiconductor layer 1130 or a first conductivity-type semiconductor layer 3100 (see FIG. 7), which is formed on the buffer layer 1120, is smoothly grown.

As an example, the buffer layer 1120 may include an undoped semiconductor. The buffer layer 1120 and the first conductivity-type semiconductor 310 of the light-emitting element 300 may include substantially the same material. The buffer layer 1120 may include a material that is not doped with a n-type or p-type dopant. In an embodiment, the buffer layer 1120 may include at least one selected from among undoped InAlGaN, GaN, AlGaN, InGaN, AlN, and InN, but the disclosure is not limited thereto.

The sub-semiconductor layer 1130 may be disposed on the buffer layer 1120. The sub-semiconductor layer 1130 may provide a seed crystal of the first conductivity-type semiconductor layer 3100 (see FIG. 7) in a method of manufacturing the light-emitting element structure 1000, which is to be described below. As an example, the sub-semiconductor layer 1130 and the first conductivity-type semiconductor 310 of the light-emitting element 300 may include a same material, but the disclosure is not limited thereto. The sub-semiconductor layer 1130 is not particularly limited as long as the sub-semiconductor layer 1130 includes a material that provides a seed crystal of the first conductivity-type semiconductor 310.

The sub-semiconductor layer 1130 may include a conductive material and may transmit an electrical signal applied from the second pad 1300 to an end of the light-emitting element 300, for example, the first conductivity-type semiconductor 310. A predetermined electrical signal applied through the second pad 1300 may be transmitted to the light-emitting element 300 through the sub-semiconductor layer 1130 and may be transmitted to the first pad 1200 through the light-emitting element 300 to be measured. For example, the sub-semiconductor layer 1130 may electrically contact the second pad 1300 and the first conductivity-type semiconductor 310 of the light-emitting element 300 to perform a current transmission function.

In an embodiment, the sub-semiconductor layer 1130 may be substantially the first conductivity-type semiconductor layer 3100. When the light-emitting element 300 described below is manufactured, only a portion of the first conductivity-type semiconductor layer 3100 may be etched and removed, and a layer may be formed on the buffer layer 1120. The sub-semiconductor layer 1130 may be substantially formed by the first conductivity-type semiconductor layer 3100 remaining without being substantially removed. However, the disclosure is not limited thereto.

The lower substrate 1100 may be a substrate on which the light-emitting element 300 is grown by the method of manufacturing the light-emitting element structure 1000, which is described below. The light-emitting element 300 may be manufactured by depositing or growing a semiconductor crystal on the lower substrate 1100. More detailed descriptions thereof will be given below.

One or more light-emitting elements 300 may be disposed on the lower substrate 1100. The structure of the light-emitting element 300 may be substantially identical to that described above with reference to FIG. 1. For example, the light-emitting element 300 may have a lower surface with a circular structure and may have a shape which extends a predetermined length from the lower substrate 1100 in the third direction (for example, the Z-axis direction). As an example, the light-emitting element 300 may include a semiconductor crystal having a rod-like shape. However, the disclosure is not limited thereto.

The first conductivity-type semiconductor 310 of the light-emitting element 300 may electrically contact the sub-semiconductor layer 1130 of the lower substrate 1100, and an electrode layer 370 may electrically contact the current spreading layer 1600. The light-emitting element 300 having both ends electrically contacting the sub-semiconductor layer 1130 and the current spreading layer 1600 may be electrically connected to the first pad 1200 and the second pad 1300.

An outer surface of the light-emitting element 300 may contact the auxiliary layer 1500 which partially surrounds the light-emitting element 300. The light-emitting element 300 may be substantially disposed inside the auxiliary layer 1500, and both ends thereof may electrically contact the sub-semiconductor layer 1130 and the current spreading layer 1600. Since a predetermined electrical signal is transmitted through the sub-semiconductor layer 1130 and the current spreading layer 1600 electrically contacting both ends of the light-emitting element 300, it is possible to measure the electrical or optical characteristics of the light-emitting element 300.

In the drawing, a light-emitting element 300 is illustrated as being disposed, but the disclosure is not limited thereto. In the light-emitting element structure 1000, one or more light-emitting elements 300 may be disposed on the lower substrate 1100. The light-emitting elements 300 may be spaced apart from each other, and in some embodiments, some of the light-emitting elements 300 may be spaced apart from each other by a relatively wide interval (or distance) to form an area in which the light-emitting element 300 are not disposed. For detailed descriptions thereof, reference is made to other embodiments.

According to the arrangement of the light-emitting element 300 disposed on the lower substrate 1100, the light-emitting element structure 1000 may include a first area EA defined as an area overlapping the light-emitting element 300 and a second area NEA defined as an area not overlapping the light-emitting element 300. In the light-emitting element structure 1000, the first area EA may be understood as an overlapping area of the light-emitting element 300, and the second area NEA may be understood as a non-overlapping area of the light-emitting element 300. However, the first area EA may not mean only an area overlapping the light-emitting element 300. The first area EA may be understood as having a predetermined range including an area, in which the light-emitting elements 300 are disposed, and an area adjacent thereto.

The second area NEA may be understood as an area not overlapping the light-emitting element 300 and as an area other than the first area EA. The second area NEA may not mean only an area not overlapping the light-emitting element 300 and may be understood as an area having a predetermined range in which the light-emitting element 300 is not disposed.

FIG. 3 illustrates that a light-emitting element 300 is disposed in a central area of the lower substrate 1100 and a first area EA and two second areas NEA symmetric to each other based on the first area EA are defined. Although not shown in FIG. 2, the arrangement of the first area EA and the second area NEA may be understood as the second area NEA being disposed to surround the first area EA in the perspective view of the light-emitting element structure 1000.

The arrangement of the first area EA and the second area NEA is not limited to that shown in FIG. 3. In case that one or more light-emitting elements 300 are disposed as described above, the light-emitting element structure 1000 may include one or more first areas EA. Accordingly, the second area NEA may be further defined between the first areas EA. In case that the light-emitting element 300 is disposed adjacent to a side of the lower substrate 1100, the first area EA may be positioned in an area biased toward a side of the light-emitting element structure 1000. The second areas NEA may have an asymmetrical structure with respect to the first area EA.

The auxiliary layer 1500 may be disposed on the lower substrate 1100 to surround the light-emitting elements 300. The auxiliary layer 1500 may have a lower surface contacting the sub-semiconductor layer 1130 of the lower substrate 1100 and may have a predetermined thickness in a direction (for example, the Z-axis direction) in which a long axis of the light-emitting element 300 extends. The auxiliary layer 1500 may perform functions of affixing the light-emitting elements 300 onto the lower substrate 1100 and supporting members disposed on the auxiliary layer 1500 (e.g., the pad 1200 and the current spreading layer 1600).

In an embodiment, the auxiliary layer 1500 may be disposed to surround the outer surface of the light-emitting element 300 and to partially expose the lower substrate 1100. The auxiliary layer 1500 may be disposed such that sides thereof extending in the first direction (for example, the X-axis direction) and the second direction (for example, the Y-axis direction) are recessed inward from the lower substrate 1500 in a plan view. For example, the auxiliary layer 1500 may have an area smaller than that of the lower substrate 1100 in a plan view so as to be included inside the lower substrate 1100. As shown in the drawing, the shape of the auxiliary layer 1500 may have a quadrangular structure in a plan view similar to that of the lower substrate 1100 and may be a hexahedron having a predetermined thickness. Accordingly, the lower substrate 1100 may include an exposed area at an outer periphery of the auxiliary layer 1500. However, the shape of the auxiliary layer 1500 is not limited thereto, and in some embodiments, the auxiliary layer 1500 may have a cylinder shape having a circular structure in a plan view.

The auxiliary layer 1500 may be formed to partially expose the electrode layer 370, which is an end of the light-emitting element 300. For example, the thickness of the auxiliary layer 1500 may be less than a length 1 of a long axis of the light-emitting element 300, and an end of the light-emitting element 300 may protrude from the auxiliary layer 1500. The auxiliary layer 1500 may be disposed to entirely overlap the first conductivity-type semiconductor 310, the element active layer 330, and the second conductivity-type semiconductor 320 of the light-emitting element 300 and to partially overlap the electrode layer 370. Accordingly, as described below, the current spreading layer 1600 disposed on the auxiliary layer 1500 may electrically contact an exposed end and outer surface of the electrode layer 370 at the same time.

The shape of the auxiliary layer 1500 may be formed by arranging the auxiliary layer 1500 so as to cover or overlap both the lower substrate 1100 and the light-emitting element 300 and then performing a predetermined etching process to partially remove the material of a specific area thereof. However, the disclosure is not limited thereto, and a material constituting the auxiliary layer 1500 may be deposited or applied such that the shape of the auxiliary layer 1500 has the structure shown in the drawing.

The auxiliary layer 1500 may be disposed in both of the first area EA and the second area NEA of the light-emitting element structure 1000. The auxiliary layer 1500 may be disposed in the first area EA and at least a portion of the second area NEA.

In the drawing, the light-emitting element 300 is illustrated as being positioned in a central area of the auxiliary layer 1500, and the second areas NEA overlapping the auxiliary layer 1500 are illustrated as having a symmetrical structure based on the first area EA. However, the disclosure is not limited thereto. The auxiliary layer 1500 may be disposed such that the light-emitting element 300 is adjacent to a side of the auxiliary layer 1500, and thus, the second areas NEA overlapping the auxiliary layer 1500 may have an asymmetrical structure. A portion of the first pad 1200 to be described below may be disposed in an area of the second area NEA overlapping the auxiliary layer 1500, and the second pad 1300 may be disposed on the exposed lower substrate 1100.

The auxiliary layer 1500 may include an insulating material. The auxiliary layer 1500 may insulate other members or other adjacent light-emitting elements 300 such that a predetermined electrical signal transmitted to the light-emitting element 300 does not flow to other members or other adjacent light-emitting elements 300. Accordingly, the light-emitting element structure 1000 may include a double insulating material of the insulating film 380 of the light-emitting element 300 and the auxiliary layer 1500. As an example, the auxiliary layer 1500 may include silicon oxide ($SiO_x$), silicon nitride ($SiN_x$), silicon oxynitride ($SiO_xN_y$), an organic insulating material, or the like, but the disclosure is not limited thereto.

The current spreading layer 1600 may be disposed on the auxiliary layer 1500. The current spreading layer 1600 and the auxiliary layer 1500 may have the same shape in a plan view. However, in order for a portion of the auxiliary layer 1500 to be exposed, the current spreading layer 1600 may be formed such that each side of the current spreading layer 1600 is recessed inward from the auxiliary layer 1500. For example, the current spreading layer 1600 may have an area smaller than that of the auxiliary layer 1500 in a plan view and may be included inside the auxiliary layer 1500. The auxiliary layer 1500 may have an exposed area formed at an outer periphery of the current spreading layer 1600. However, the disclosure is not limited thereto.

The current spreading layer 1600 may have a thickness so as to cover or overlap the light-emitting elements 300. As shown in the drawing, the current spreading layer 1600 may be disposed to overlap an end of the light-emitting element 300 protruding from the auxiliary layer 1500 and electrically contact the light-emitting element 300. As shown in the drawing, a lower surface of the current spreading layer 1600 may partially surround the outer surface of the light-emitting element 300 and may electrically contact an end of the electrode layer 370. The lower surface of the current spreading layer 1600 may have an uneven structure along a protruding area of the light-emitting element 300. In contrast, an upper surface of the current spreading layer 1600 may have a substantially flat shape.

The current spreading layer 1600 may include a conductive material to spread a transmitted electrical signal. Accordingly, as described above, the current spreading layer 1600 may transmit a predetermined electrical signal transmitted from the first pad 1200 described below to the light-emitting element 300. The current spreading layer 1600 may electrically contact the light-emitting elements 300 at the same time and thus may uniformly transmit the electrical signal to the light-emitting elements 300.

The current spreading layer 1600 may include a transparent material. In case that the optical characteristics of the light-emitting element 300 are measured using the light-emitting element structure 1000, as described above, in the light-emitting element 300, light may be emitted from the element active layer 330. Here, the current spreading layer 1600 may include a transparent material such that light emitted from the light-emitting element 300 may be measured from the outside.

In an embodiment, the current spreading layer 1600 may form an ohmic contact with the electrode layer 370 of the light-emitting element 300. However, the disclosure is not limited thereto, and the current spreading layer 1600 and the electrode layer 370 may form a Schottky contact. As an example, the current spreading layer 1600 may include a material such as ITO, IZO, or ITZO, but the disclosure is not limited thereto.

The light-emitting element structure 1000 may include the first pad 1200 and the second pad 1300 to transmit a predetermined electrical signal to the light-emitting element 300. The first pad 1200 and the second pad 1300 may be electrically connected to the light-emitting element 300. The first pad 1200 and the second pad 1300 electrically connected to an external power source may provide power for measuring the emission characteristics of the light-emitting element 300. In some embodiments, the first pad 1200 and the second pad 1300 may be electrically connected to another external measuring device to provide a signal for measuring the electrical characteristics of the light-emitting element 300.

The first pad 1200 may be disposed on the current spreading layer 1600. A lower surface of the first pad 1200 may electrically contact the current spreading layer 1600. An electrical signal transmitted to the first pad 1200 may be transmitted to an end of the light-emitting element 300, for example, the electrode layer 370 through the current spreading layer 1600.

The second pad 1300 may be disposed on the lower substrate 1100. The second pad 1300 may be disposed on the sub-semiconductor layer 1130 of the lower substrate 1100, on which the auxiliary layer 1500 is not disposed and which is exposed. A lower surface of the second pad 1300 may electrically contact the sub-semiconductor layer 1130. A predetermined electrical signal transmitted to the second pad 1300 may be transmitted to an end of the light-emitting element 300, for example, the first conductivity-type semiconductor 310, through the sub-semiconductor layer 1130. Accordingly, the first pad 1200 and the second pad 1300 may function as electrodes that transmit electrical signals to the light-emitting element 300.

In an embodiment, the first pad 1200 and the second pad 1300 may include a conductive material or a conductive metal. The first pad 1200 and the second pad 1300 electrically connected to the external power source may include a conductive material to transmit an electrical signal transmitted from the external power source to the light-emitting element 300. Unlike the current spreading layer 1600, the first pad 1200 may not include a transparent material. As described below, since the first pad 1200 is disposed to not overlap the light-emitting element 300, the first pad 1200 may not block the emission of light. Accordingly, the first pad 1200 may include an opaque material.

As an example, the first pad 1200 and the second pad 1300 may include a material such as Ag, nickel (Ni), Al, palladium (Pd), Mg, Zn, platinum (Pt), Au, Ti, In, ITO, IZO, or ITZO, but the disclosure is not limited thereto.

The first pad 1200 and the second pad 1300 may have a structure for uniformly transmitting the electrical signal to the light-emitting elements 300. For example, in case that the light-emitting element structure 1000 includes the light-emitting elements 300 and the first pad 1200 and the second pad 1300 are disposed adjacent to an arbitrary light-emitting element 300, an electrical signal may not be smoothly transmitted to the light-emitting element 300 spaced a relatively long distance apart from the first pad 1200 and the second pad 1300. In order to uniformly transmit an electrical signal, the first pad 1200 and the second pad 1300 according to an embodiment may be disposed to surround the first area EA, which is an area overlapping the light-emitting element 300.

FIG. 3 illustrates a schematic cross-sectional view of the light-emitting element structure 1000 and illustrates that portions of the first pad 1200 and the second pad 1300 are provided. However, according to an embodiment, the first pad 1200 may include an extension portion 1210 and an electrode line 1220 electrically connected to the extension portion 1210, and the second pad 1300 may be disposed to surround the outer periphery of the auxiliary layer 1500. For detailed descriptions of the first pad 1200 and the second pad 1300, reference is made to FIG. 4.

Figure 4:
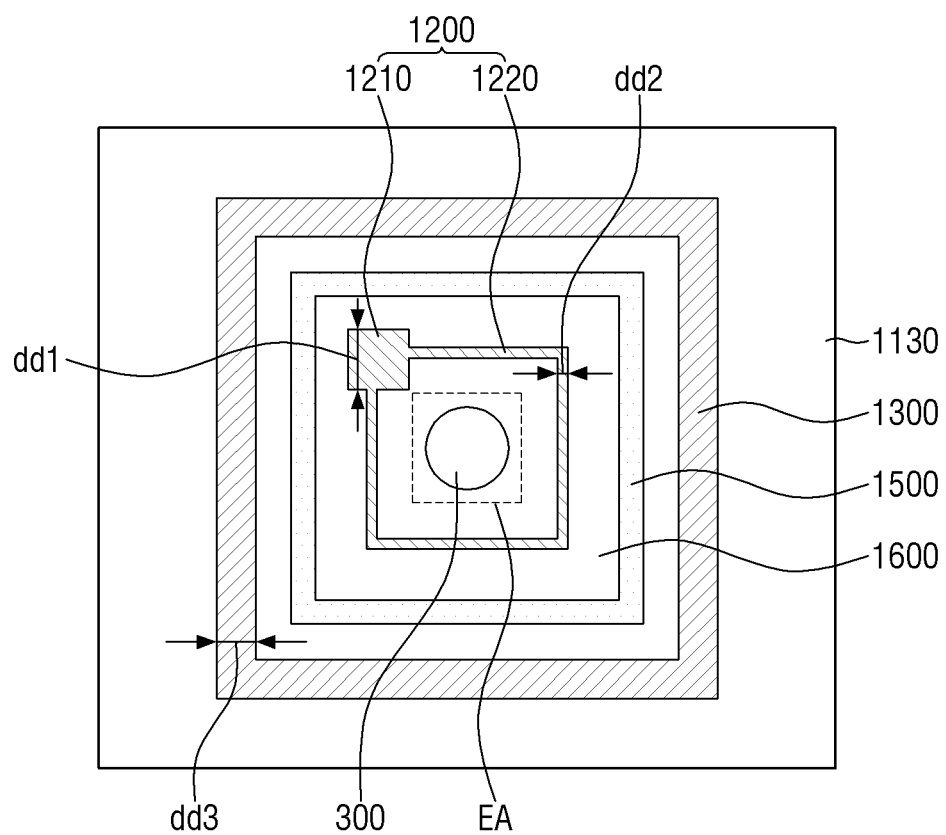
FIG. 4 is a schematic plan view of the light-emitting element structure of FIG. 1 viewed from above.

FIG. 4 is a schematic plan view of the light-emitting element structure of FIG. 1.

Referring to FIG. 4, the first pad 1200 may include the extension portion 1210 and the electrode line 1220 electrically connected to the extension portion 1210.

The extension portion 1210 may directly contact the external power source. An electrical signal may be transmitted from the external power source to the extension portion 1210 and be transmitted to the electrode line 1220 electrically connected to the extension portion 1210. However, since a lower surface of the extension portion 1210 electrically contacts the current spreading layer 1600, the transmitted electrical signal may be transmitted directly to the current spreading layer 1600. For example, the electrical signal may be divided and transmitted to the current spreading layer 1600 and the electrode line 1220 from the extension portion 1210.

The electrode line 1220 may be disposed on the current spreading layer 1600 and may be electrically connected to the extension portion 1210. As described above, the electrode line 1220 may receive an electrical signal from the extension portion 1210 and may transmit the electrical signal to the current spreading layer 1600. An electrical signal transmitted from the external power source may be uniformly transmitted to the current spreading layer 1600 through the extension portion 1210 and the electrode line 1220 of the first pad 1200.

As shown in the drawing, the shape of the extension portion 1210 and the electrode line 1220 may be a quadrangular shape in a plan view but is not limited thereto. In some embodiments, the extension portion 1210 may have a circular shape or another polygonal shape, and the electrode line 1220 may be understood in the same manner.

According to an embodiment, a width dd1 or area of the extension portion 1210 may be greater than a width dd2 or area of the electrode line 1220. As shown in the drawing, the width dd2 of the electrode line 1220 may be relatively narrow, and the width dd1 of the extension portion 1210 may be relatively wide. As described below, in case that the characteristics of the light-emitting element 300 are measured using the light-emitting element structure 1000, the first pad 1200 may be electrically connected to a probe (see FIG. 5) of the external power source. Here, a portion of the first pad 1200 electrically connected to the external power source may be the extension portion 1210 having a relatively wide width. The external power source electrically connected to the extension portion 1210 may transmit an electrical signal, and the electrical signal may be transmitted to the electrode line 1220 having a relatively narrow width through the extension portion 1210.

The electrode line 1220 may be electrically connected to the extension portion 1210 and may be disposed on the current spreading layer 1600. The extension portion 1210 and the electrode line 1220 may be directly contact each other to be electrically connected. An area of the extension portion 1210 electrically contacting the electrode line 1220 may be an area that extends in a straight line from a center of the extension portion 1210 in the first direction (for example, the X-axis direction) and the second direction (for example, the Y-axis direction). For example, the electrode line 1220 may extend in a straight line from the center of the extension portion 1210. However, the disclosure is not limited thereto, and an extension area of the electrode line 1220 may not be on the same straight line as the center of the extension portion 1210.

In some embodiments, the electrode line 1220 may be spaced apart from the extension portion 1210 and may be electrically connected to the extension portion 1210 through a connection portion. For example, the electrode line 1220 may not directly contact the extension portion 1210 but may be electrically connected to the extension portion 1210 through a connection portion electrically contacting the extension portion 1210. This will be described below with reference to other embodiments.

The first pad 1200 may be disposed on the current spreading layer 1600 and may be disposed in the second area NEA to not overlap the light-emitting element 300. The extension portion 1210 of the first pad 1200 may be disposed in the second area NEA and be disposed adjacent to a side of the first area EA. The electrode line 1220 electrically connected to the extension portion 1210 may be disposed in the second area NEA and may surround an outer periphery of the first area EA.

The extension portion 1210 of the first pad 1200 may be disposed on the current spreading layer 1600 to not overlap the light-emitting element 300. The extension portion 1210 may be disposed adjacent to the first area EA in the second area NEA and be spaced apart from the light-emitting element 300. In case that the extension portion 1210 is disposed far away from the first area EA, an area surrounded by the electrode line 1220 described below may be increased, and an electrical signal may be inefficiently transmitted to the current spreading layer 1600. Accordingly, the extension portion 1210 of the first pad 1200 may be disposed adjacent to the light-emitting element 300.

The electrode line 1220 of the first pad 1200 may be electrically connected to the extension portion 1210 and may surround the light-emitting element 300. The electrode line 1220 may surround the first area EA in the second area NEA that does not overlap the light-emitting element 300. For example, the electrode line 1220 of the first pad 1200 may be substantially disposed at a boundary between the first area EA and the second area NEA to separate the first area EA from the second area NEA. Accordingly, the first pad 1200 may uniformly transmit an electrical signal to an end of the light-emitting element 300, for example, the electrode layer 370 through the current spreading layer 1600. However, the structure of the first pad 1200 is not limited thereto. The first pad 1200 may have various structures including the extension portion 1210 and the electrode line 1220. As an example, the first pad 1200 may have substantially a grid structure or a branched structure.

As described above, since the first pad 1200 may be disposed on the current spreading layer 1600, as shown in FIG. 3, the first pad 1200 may be disposed on the light-emitting element 300 in a cross section. Even in case that the first pad 1200 is disposed in the second area NEA, the first pad 1200 may be disposed on the current spreading layer 1600 overlapping the auxiliary layer 1500 in which the light-emitting elements 300 are positioned. Unlike that shown in FIG. 4, in case that the light-emitting element structure 1000 includes the light-emitting elements 300, the first pad 1200 may be disposed in the second area NEA formed by first areas EA, in which the light-emitting elements 300 are disposed and which are spaced apart from each other. However, the disclosure is not limited thereto.

Therefore, in case that the characteristics of the light-emitting element 300 are measured using the light-emitting element structure 1000, it is possible to prevent the measurement from being disturbed by the first pad 1200. For example, in case that the intensity of light emitted from the light-emitting element 300 is measured, and in case that the light is partially blocked by the first pad 1200, the accurate measurement of the intensity of the light may be disturbed. Since the first pad 1200 is disposed to not overlap the light-emitting element 300, the light-emitting element structure 1000 according to an embodiment may accurately measure the electrical and optical characteristics of the light-emitting element 300.

The second pad 1300 may be disposed on the sub-semiconductor layer 1130 of the lower substrate 1100 and may surround the outer periphery of the auxiliary layer 1500. Sides of the second pad 1300 extending in the first direction (for example, the X-axis direction) and the second direction (for example, the Y-axis direction) may be connected and surround the outer periphery of the auxiliary layer 1500. The sides of the second pad 1300 may be angularly connected at a point at which the sides meet each other, but the disclosure is not limited thereto. The sides may be connected to be rounded at a predetermined curvature. Furthermore, the second pad 1300 may have a circular shape depending on the shape of the lower substrate 1100 or the auxiliary layer 1500.

The second pad 1300 may be disposed at the outer periphery of the auxiliary layer 1500 so as to be spaced apart from an outer surface of the auxiliary layer 1500 by a predetermined distance. The second pad 1300 may not directly contact the auxiliary layer 1500 and may electrically contact only the sub-semiconductor layer 1130. The second pad 1300 spaced apart from the auxiliary layer 1500 may have a predetermined width dd3.

Similar to the extension portion 1210 of the first pad 1200, the second pad 1300 may have a width such as to electrically contact the probe (see FIG. 5) of the external power source. Unlike the first pad 1200, the second pad 1300 may have an identical width dd3 and may surround the outer periphery of the auxiliary layer 1500. The width dd3 of the second pad 1300 may be greater than the width dd2 of the electrode line 1220 of the first pad 1200. However, the width dd3 of the second pad 1300 is not limited as long as the width dd3 is within a range in which the second pad 1300 may electrically contact the probe (see FIG. 5). In some embodiments, the width dd3 of the second pad 1300 may be greater than the width dd1 of the extension portion 1210 of the first pad 1200.

The second pad 1300 may be disposed in the second area NEA of the lower substrate 1100, in which the light-emitting element 300 is not disposed. As shown in the drawing, since the second area NEA surrounds the first area EA, the second pad 1300 may also surround the light-emitting elements 300 in a plan view. The second pad 1300, which surrounds the light-emitting elements 300 at an outer periphery of an area in which the light-emitting elements 300 are disposed, may uniformly transmit an electrical signal to the light-emitting elements 300 through the sub-semiconductor layer 1130.

As described above, the light-emitting element structure 1000 may include the light-emitting elements 300 and may include the first pad 1200 and the second pad 1300 which are electrically connected to both ends of the light-emitting element 300. The first pad 1200 and the second pad 1300 electrically connected to the external power source may transmit electrical signals to the light-emitting element 300 through the current spreading layer 1600 and the sub-semiconductor layer 1130. Accordingly, the light-emitting element structure 1000 may evaluate the electrical and optical characteristics of the manufactured light-emitting element 300.

Figure 5:
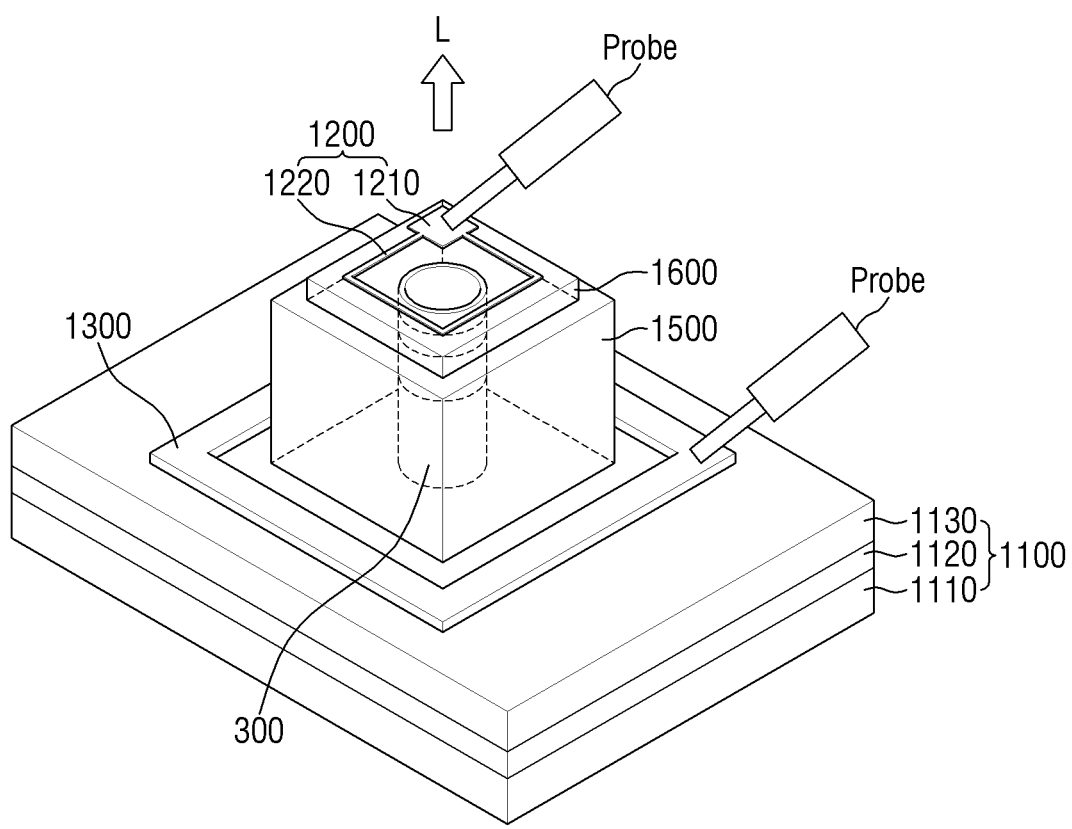
FIG. 5 is a schematic perspective view illustrating the evaluation of characteristics of the light-emitting element according to an embodiment.

FIG. 5 is a schematic view illustrating the evaluation of characteristics of the light-emitting element according to an embodiment.

Referring to FIG. 5, the first pad 1200 and the second pad 1300 of the light-emitting element structure 1000 according to an embodiment may be electrically connected to the probes of the external power source. The probes may electrically contact the extension portion 1210 of the first pad 1200 and a side of the second pad 1300. The extension portion 1210 wider than the electrode line 1220 may electrically contact the probe. An electrical signal transmitted through the probe electrically contacting the first pad 1200 may be transmitted to the electrode layer 370 of the light-emitting element 300 through the first pad 1200 and the current spreading layer 1600. An electrical signal transmitted through the probe electrically contacting the second pad 1300 may be transmitted to the first conductivity-type semiconductor 310 of the light-emitting element 300 through the second pad 1300 and the sub-semiconductor layer 1130.

The electrical signals transmitted to the first conductivity-type semiconductor 310 and the electrode layer 370 may flow in the light-emitting element 300, and thus, the electrical and optical characteristics of the light-emitting element 300 may be measured. An electrical flow in or light emitted from the light-emitting element 300 may be measured through a separate measuring device, whereby the light-emitting element structure 1000 can evaluate the defects, emission defects, or characteristics of the light-emitting element 300.

As an example, in case that light emitted from the light-emitting element 300 is measured as shown in the drawing, the light may be emitted upward from the light-emitting element structure 1000. Here, since the first pad 1200 of the light-emitting element structure 1000 is disposed to not overlap the light-emitting element 300, the light may be emitted to the outside without being blocked by other members. For example, the light-emitting element structure 1000 may accurately measure the intensity of the light emitted from the light-emitting element 300.

Hereinafter, a method of manufacturing the light-emitting element structure 1000 will be described. As described above, the light-emitting element 300 may be grown on the lower substrate 1100 of the light-emitting element structure 1000 and manufactured. For example, the method of manufacturing the light-emitting element structure 1000 may include providing the light-emitting element 300.

Figure 6:
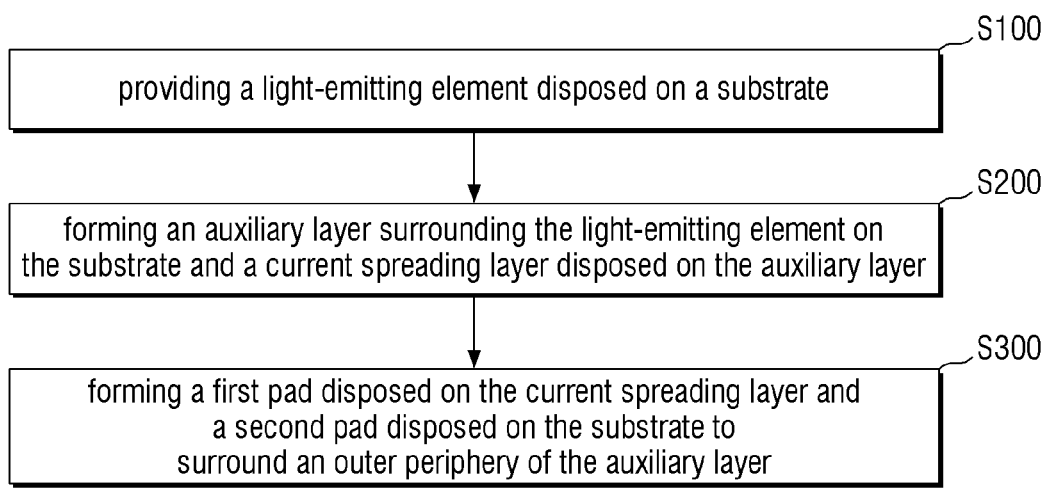
FIG. 6 is a schematic flowchart illustrating a method of manufacturing a light-emitting element structure according to an embodiment.

FIG. 6 is a schematic flowchart illustrating a method of manufacturing a light-emitting element structure according to an embodiment.

Referring to FIG. 6, a light-emitting element structure 1000 may be manufactured by providing a light-emitting element 300 on a lower substrate 1100 (S100), forming an auxiliary layer 1500 disposed on the lower substrate 1100 to surround the light-emitting element 300 and a current spreading layer 1600 disposed on the auxiliary layer 1500 (S200), and forming a first pad 1200 on the current spreading layer 1600 and forming a second pad 1300 surrounding an outer periphery of the auxiliary layer 1500 on the lower substrate 1100 (S300).

A method of manufacturing the light-emitting element structure 1000 according to an embodiment may include providing the lower substrate 1100 and one or more light-emitting elements 300 which are disposed on the lower substrate 1100 and have a shape extending in a direction perpendicular to the lower substrate 1100, forming the auxiliary layer 1500 surrounding an outer surface of the light-emitting element 300 on the lower substrate 1100 and the current spreading layer 1600 disposed on the auxiliary layer 1500 electrically contacting an end of the light-emitting element 300, and forming the first pad 1200 disposed on the current spreading layer 1600 and electrically connected to an end of the light-emitting element 300 and the second pad 1300 disposed on the lower substrate 1100 to surround the outer periphery of the auxiliary layer 1500 and electrically connected to another end of the light-emitting element 300.

The method of manufacturing the light-emitting element structure 1000 may include providing the light-emitting element 300 on the lower substrate 1100 and forming the auxiliary layer 1500, the current spreading layer 1600, the first pad 1200, and the second pad 1300 on the lower substrate 1100. First, the providing of the light-emitting element 300 disposed on the lower substrate 1100 will be described with reference to FIGS. 7 to 10.

FIGS. 7 to 10 are schematic cross-sectional views illustrating a method of manufacturing the light-emitting element in the method of manufacturing the light-emitting element structure according to an embodiment.

Figure 7:
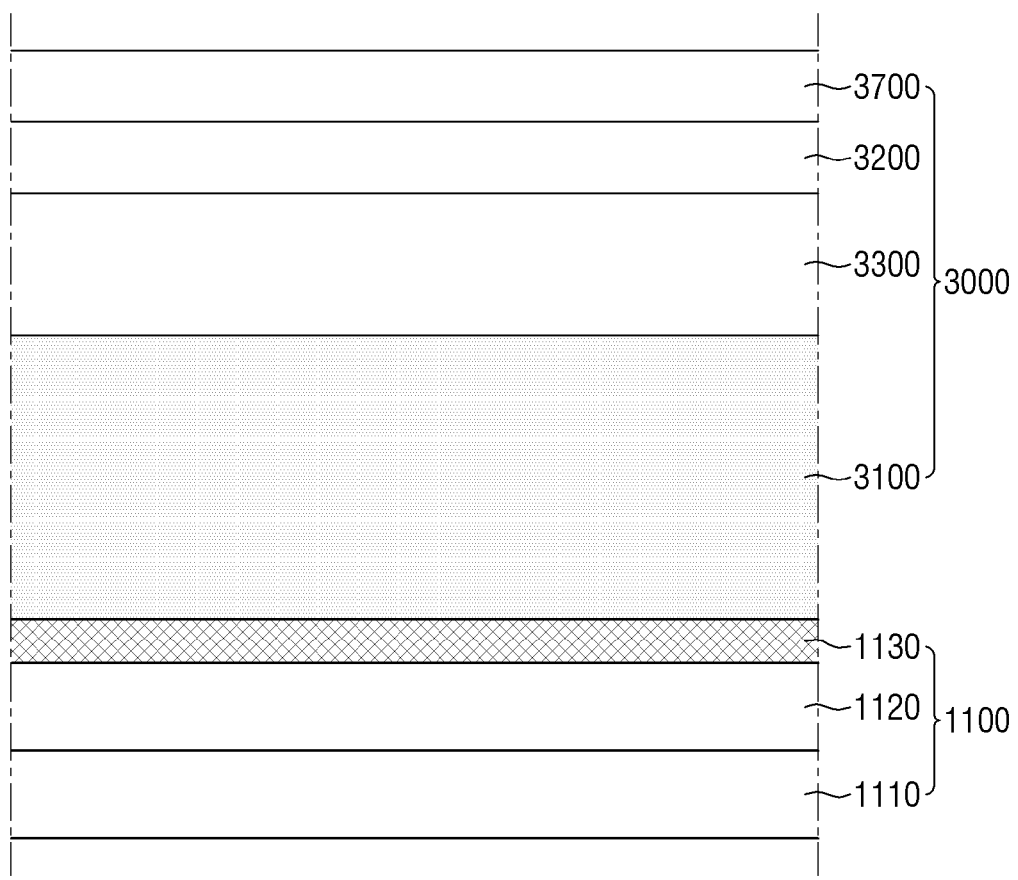
FIGS. 7 to 10 are schematic cross-sectional views illustrating a method of manufacturing a light-emitting element in the method of manufacturing the light-emitting element structure according to an embodiment.

Referring to FIG. 7, a semiconductor structure 3000 formed on the lower substrate 1100 is provided. As described above, the lower substrate 1100 may include a base substrate 1110, a buffer layer 1120, and a sub-semiconductor layer 1130. Detailed descriptions of the lower substrate 1100 will be omitted.

The semiconductor structure 3000 may be formed on the sub-semiconductor layer 1130 of the lower substrate 1100. The semiconductor structure 3000 may include a first conductivity-type semiconductor layer 3100, an active layer 3300, a second conductivity-type semiconductor layer 3200, and a conductive electrode layer 3700. As shown in FIG. 7, the semiconductor structure 3000 may have a structure in which the first conductivity-type semiconductor layer 3100, the active layer 3300, the second conductivity-type semiconductor layer 3200, and the conductive electrode layer 3700 are sequentially stacked.

The semiconductor structure 3000 may be partially etched to form the light-emitting element 300 in an operation described below. For example, the stacked members of the semiconductor structure 3000 may be understood as corresponding to a first conductivity-type semiconductor 310, an element active layer 330, a second conductivity-type semiconductor 320, and an electrode layer 370 of the light-emitting element 300.

Conductivity-type semiconductor layers may be formed on the lower substrate 1110. The conductivity-type semiconductor layers may be grown through an epitaxial method of forming a seed crystal and depositing a crystal material thereon. Here, the conductivity-type semiconductor layer may be formed by an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition method (MOCVD), or the like. However, the disclosure is not limited thereto.

A precursor material for forming the conductivity-type semiconductor layers is not particularly limited as long as the precursor material may be typically selected in order to form a target material. As an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but is not limited thereto. Hereinafter, a method of or process conditions for forming the conductivity-type semiconductor layers will be omitted, and the method of manufacturing the light-emitting element will be described below.

At least a portion of the semiconductor structure 3000 may be etched in a direction perpendicular to the lower substrate 1100 to form a semiconductor crystal 3000'.

An operation of vertically etching the semiconductor structure 3000 to form the semiconductor crystal 3000' may include a patterning process that may be typically performed. As an example, the etching of the semiconductor structure 3000 to form the semiconductor crystal 3000' may include forming an etching mask layer 2600 and an etching pattern layer 2700 on the semiconductor structure 3000, etching the semiconductor structure 3000 according to a pattern of the etching pattern layer 2700, and removing the etching mask layer 2600 and the etching pattern layer 2700.

Figure 8:
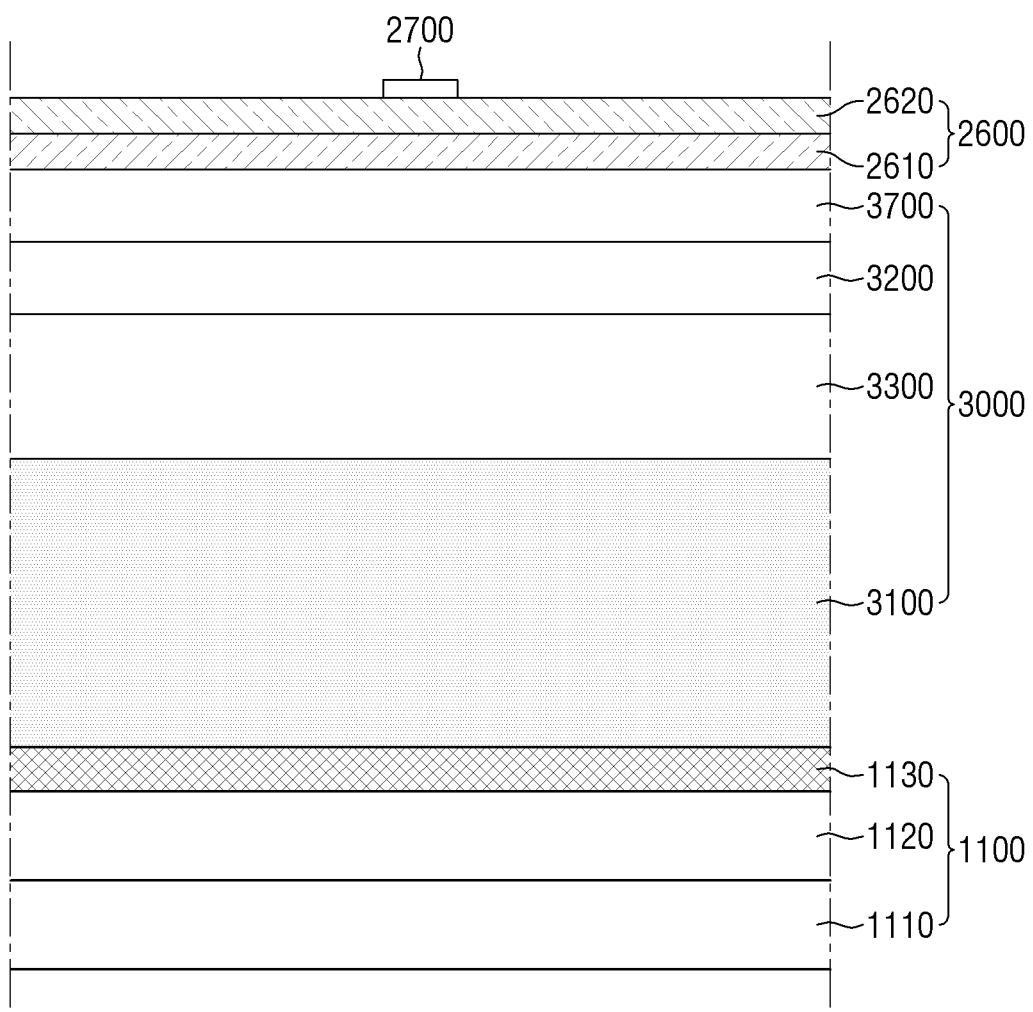

First, referring to FIG. 8, the etching mask layer 2600 and the etching pattern layer 2700 may be formed on the semiconductor structure 3000.

The etching mask layer 2600 may function as a mask for continuous etching of the first conductivity-type semiconductor layer 3100, the active layer 3300, the second conductivity-type semiconductor layer 3200, and the conductive electrode layer 3700 of the semiconductor structure 3000. The etching mask layer 2600 may include a first etching mask layer 2610 including an insulating material and a second etching mask layer 2620 including a metal.

The etching pattern layer 2700 formed on the etching mask layer 2600 may include one or more nanopatterns spaced apart from each other. Although only one nanopattern is illustrated in the drawing to be disposed, the disclosure is not limited thereto, and more nanopatterns may be disposed to be spaced apart from each other. Intervals between the nanopatterns may be different. For example, some nanopatterns may be spaced apart from each other at the same interval, and other nanopatterns may be spaced apart from each other at different intervals. For detailed descriptions thereof, reference is made to other embodiments.

The etching pattern layer 2700 may function as a mask for continuous etching the semiconductor structure 3000. A method of forming the etching pattern layer 2700 is not particularly limited as long as the method is a method capable of forming a pattern using a polymer, a polystyrene sphere, a silica sphere, or the like. As an example, the etching pattern layer 2700 may be formed by a method such as a photolithography method, an e-beam lithography method, or a nanoimprint lithography method.

Figure 9:
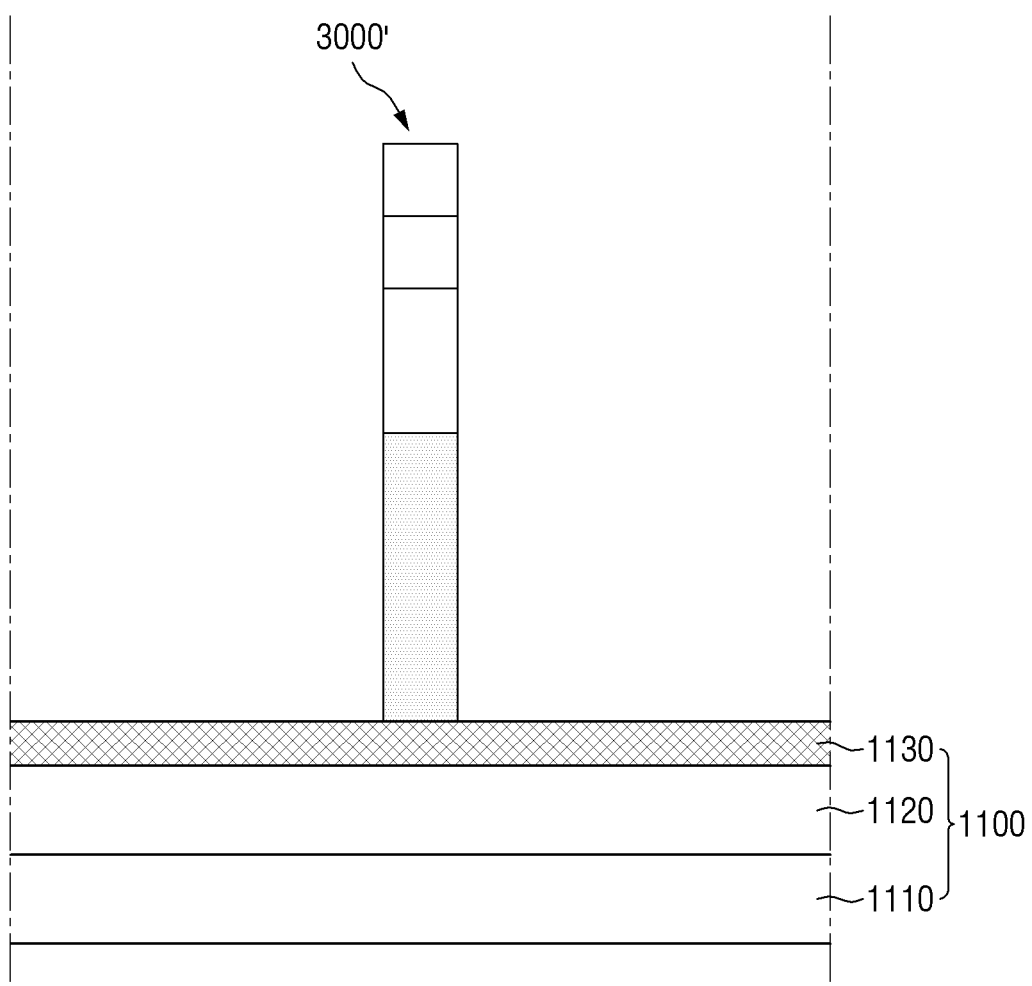
Figure 10:
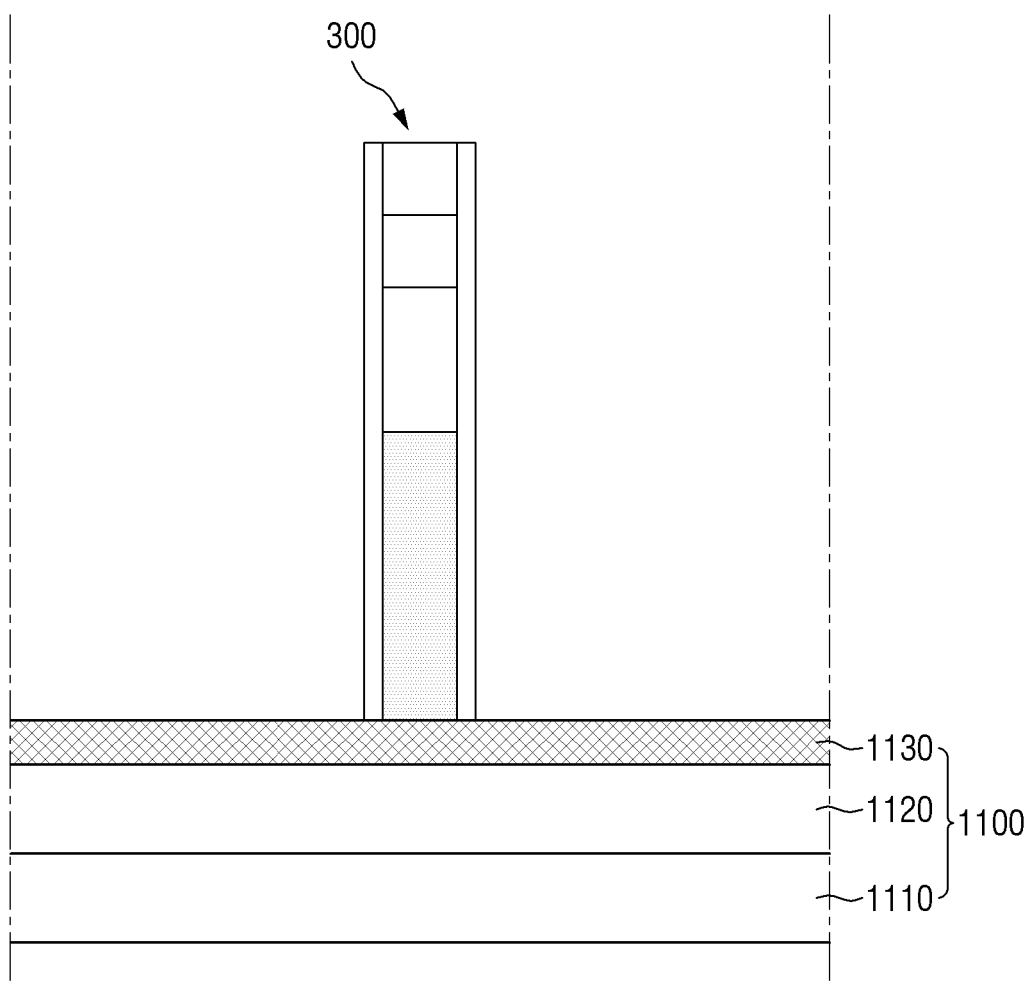

Referring to FIG. 9, the semiconductor structure 3000 may be etched along the nanopatterns of the etching pattern layer 2700 to form the semiconductor crystal 3000', and the etching mask layer 2600 and the etching pattern layer 2700 are removed.

The forming of the semiconductor crystal 3000' may be performed by a typical method. For example, an etching process may be performed by a dry etching method, a wet etching method, a reactive ion etching (RIE) method, an inductively coupled plasma reactive ion etching (ICP-RIE) method, or the like. Anisotropic etching may be performed by the dry etching method, and thus, the dry etching method may be suitable for vertical etching. In case that the above-described etching method is used, an etchant may be Cl2, O2, or the like. However, the disclosure is not limited thereto.

In some embodiments, the semiconductor structure 3000 may be etched by a combination of a dry etching method and a wet etching method. For example, etching may be firstly performed in a depth direction by the dry etching method, and an etched sidewall may be placed on a planar surface perpendicular to a surface by the wet etching method, which is an isotropic etching method.

Subsequently, the light-emitting element 300 may be formed by forming an insulating film 380 partially surrounding an outer surface of the semiconductor crystal 3000'.

The insulating film 380 may be an insulating material formed on the outer surface of the light-emitting element 300 and may be formed using a method of applying an insulating material onto an outer surface of the vertically etched semiconductor crystal 3000' or immersing the outer surface in the insulating material. However, the disclosure is not limited thereto. As an example, the insulating film 380 may be formed by an atomic layer deposition (ALD) method. As described above, the insulating film 3800 may include silicon oxide ($SiO_x$), silicon nitride ($SiN_x$), silicon oxynitride ($SiO_xN_y$), aluminum oxide ($Al_2O_3$), aluminum nitride (AlN), or the like.

Although not shown in the drawing, after the insulating film 380 may be formed on a side surface and an upper surface of the semiconductor crystal 3000' and on the sub-semiconductor layer 1130 externally exposed by the semiconductor crystal 3000' being etched and separated, the insulating film 380 may be partially removed and formed. To this end, a process of dry etching, etchback, or the like, which is anisotropic etching, may be performed.

By the above method, one or more light-emitting elements 300 disposed on the lower substrate 1100 may be provided. In case that the light-emitting element 300 is separated from the lower substrate 1100, the light-emitting element 300 of FIG. 1 may be manufactured and may be included in a display device 10 to be described below. However, as described above, the light-emitting element structure 1000 may be manufactured by forming the auxiliary layer 1500, the current spreading layer 1600, the first pad 1200, and the second pad 1300 on the lower substrate 1100.

FIGS. 11 to 14 are schematic cross-sectional views illustrating parts of the method of manufacturing the light-emitting element structure according to an embodiment.

Figure 11:
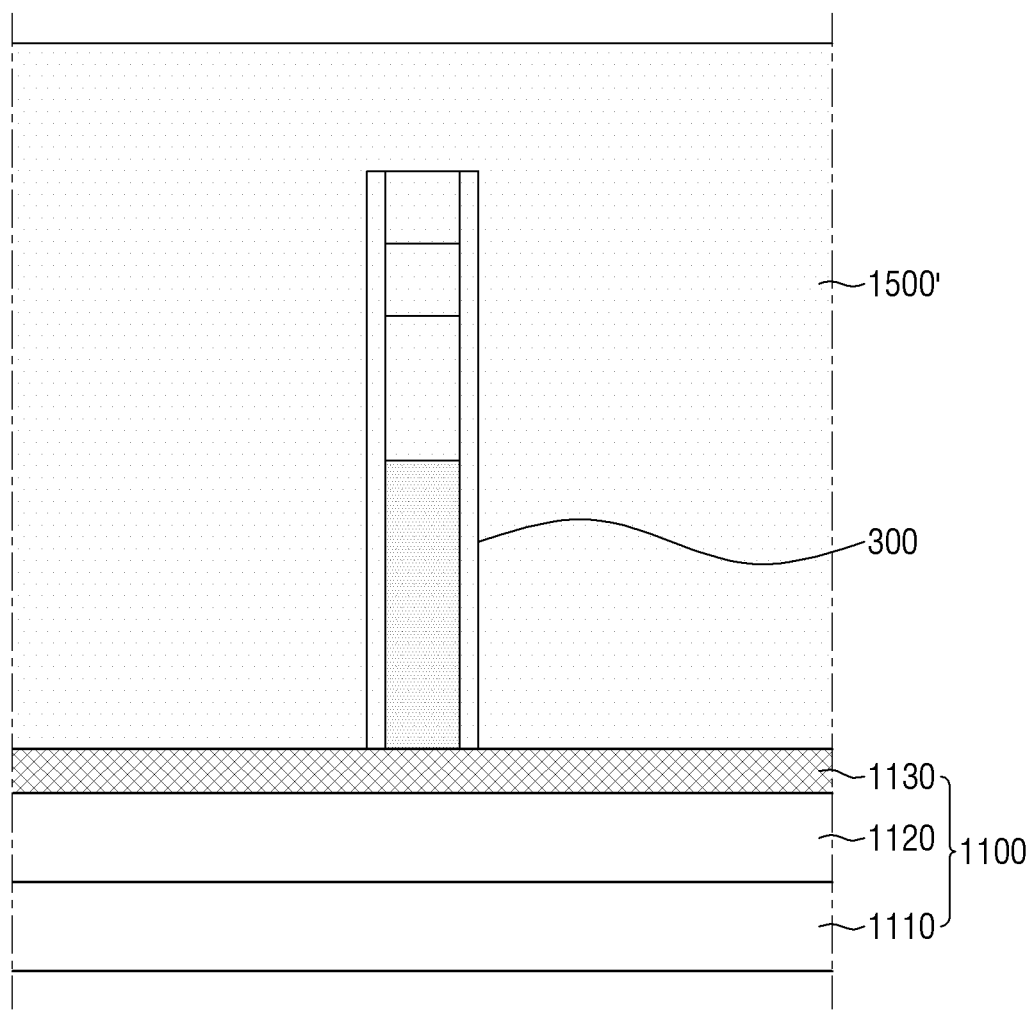
FIGS. 11 to 14 are schematic cross-sectional views illustrating parts of the method of manufacturing the light-emitting element structure according to an embodiment.

First, referring to FIG. 11, a sub-auxiliary layer 1500' may be formed to overlap an entire area of the lower substrate 1100. The sub-auxiliary layer 1500' may be partially patterned to form the auxiliary layer 1500 in an operation to be described below. The sub-auxiliary layer 1500' may be formed to surround an outer peripheral surface of the light-emitting element 300. Unlike the auxiliary layer 1500, the sub-auxiliary layer 1500' may be formed not to expose the lower substrate 1100 and an end of the light-emitting element 300. For example, the sub-auxiliary layer 1500' may overlap the entire area of the lower substrate 1100 and may have a thickness greater than a length l of a long axis of the light-emitting element 300. An operation of forming the sub-auxiliary layer 1500' may be performed by a typical deposition or patterning process.

Figure 12:
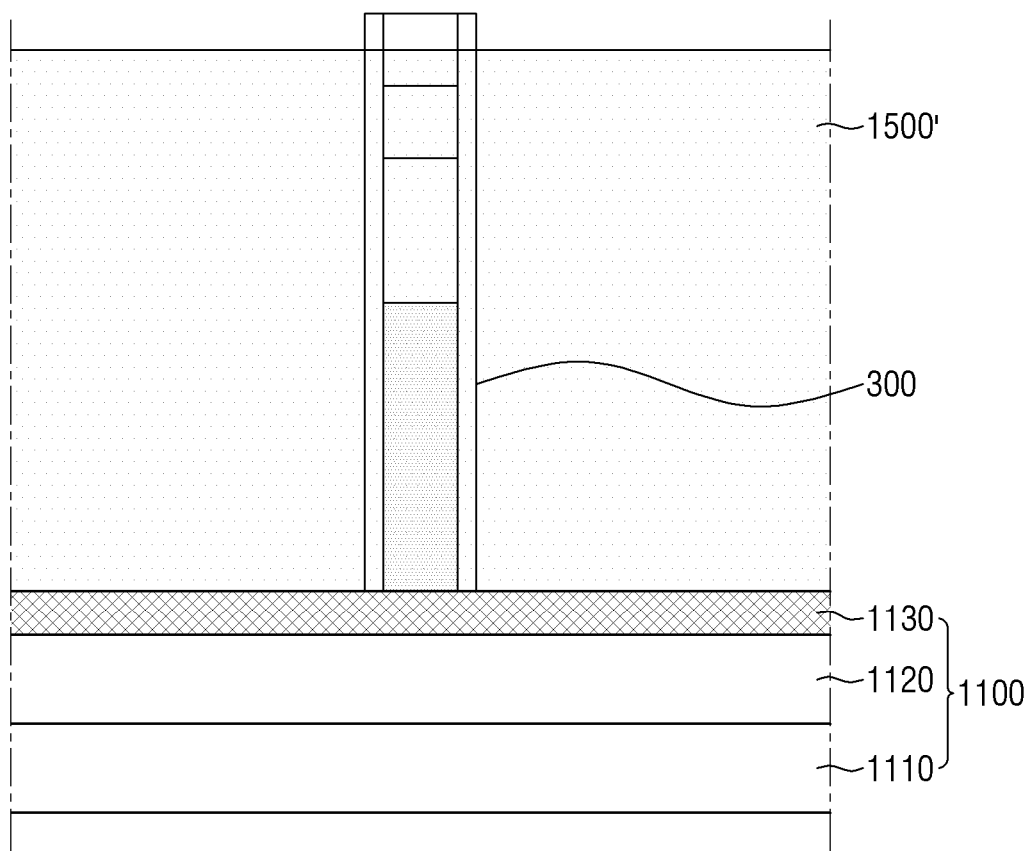
Figure 13:
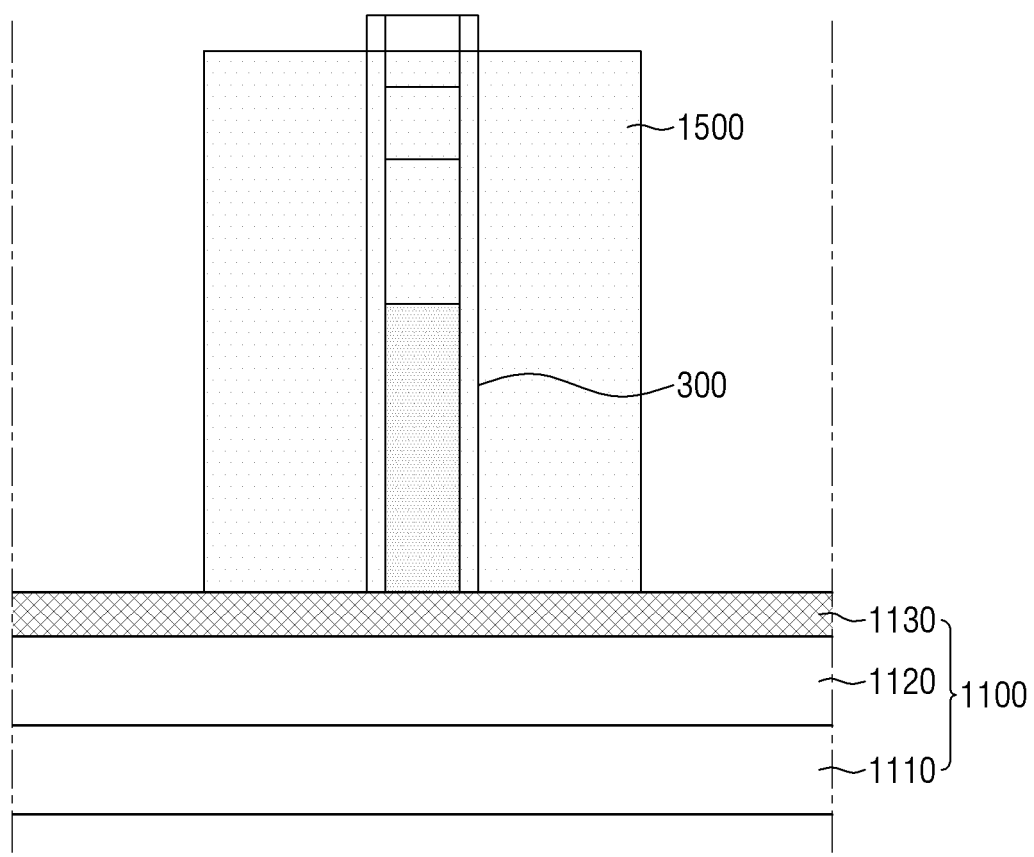

Referring to FIGS. 12 and 13, the sub-auxiliary layer 1500' may be patterned to partially expose an end of the light-emitting element 300 and may be patterned to expose the lower substrate 1100, thereby forming the auxiliary layer

1500. A process of patterning the sub-auxiliary layer 1500' may be performed by a typical etching or patterning process. For example, the sub-auxiliary layer 1500' may be patterned by spin-on-glass (SOG), an etching process, or like using an etchant including carbon tetrafluoride ($CF_4$) and oxygen ($O_2$), benzocyclobutene (BCB), or SU-8, or the like. However, the disclosure is not limited thereto.

As shown in the drawing, by the above-described method, the sub-auxiliary layer 1500' may be selectively patterned to expose an end of the electrode layer 370 of the light-emitting element 300 and a portion of the outer surface of the light-emitting element 300. Accordingly, an end of the light-emitting element 300 may protrude from an upper surface of the formed auxiliary layer 1500.

Figure 14:
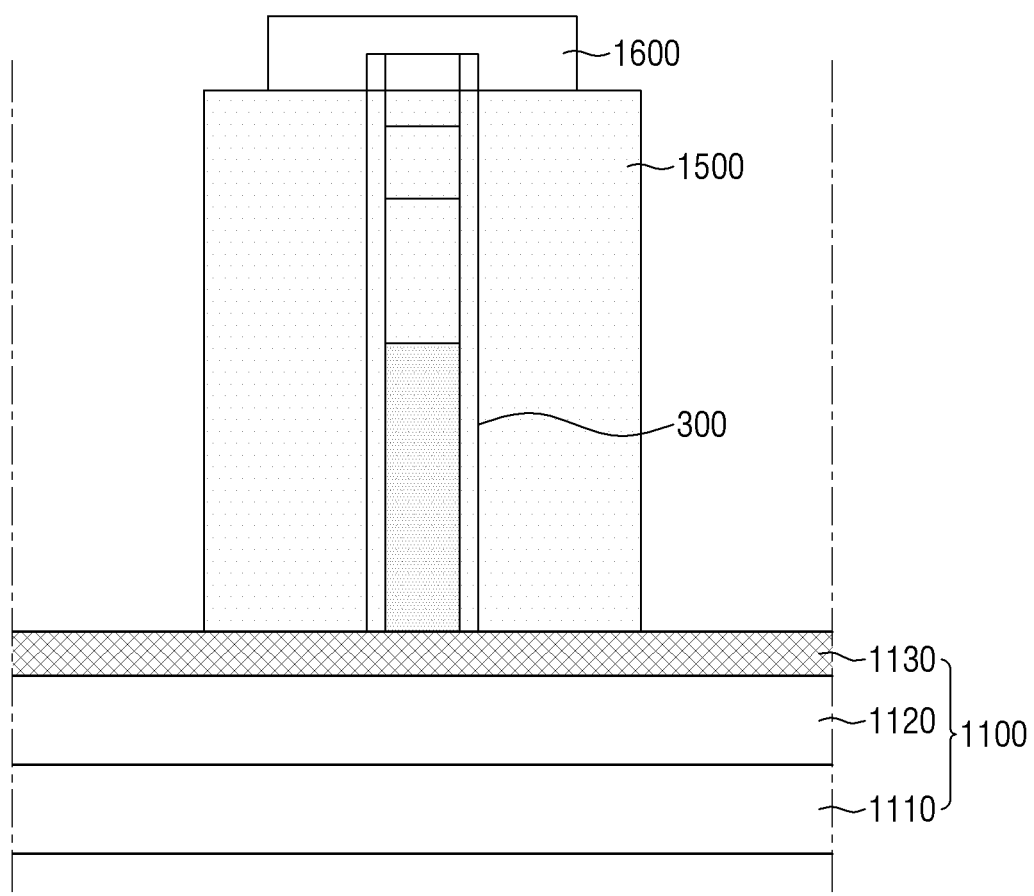

Referring to FIG. 14, the current spreading layer 1600 may be formed to overlap the electrode layer 370 of the light-emitting element 300 protruding from the auxiliary layer 1500. The structure, material, or the like of the current spreading layer 1600 may be identical to that described above.

Although not shown in the drawing, the first pad 1200 may be formed in a first area EA on the current spreading layer 1600, and the second pad 1300 may be formed on the exposed lower substrate 1100 to surround the auxiliary layer 1500. The arrangement and shape of the first pad 1200 and the second pad 1300 may be identical to those described above with reference to FIGS. 2 to 4. Detailed descriptions thereof will be omitted.

By the above processes, the light-emitting element structure 1000 according to an embodiment may be manufactured. FIGS. 7 to 14 illustrate the method of manufacturing the light-emitting element structure 1000 including a light-emitting element 300. However, as described above, the light-emitting element structure 1000 may include more light-emitting elements 300. For detailed descriptions thereof, reference is made to other embodiments.

Hereinafter, various embodiments of the light-emitting element structure 1000 according to an embodiment will be described.

FIGS. 15 to 18 are schematic plan views of light-emitting element structures according to other embodiments.

As described above, the members of the light-emitting element structure 1000 are not limited to the structure shown in FIGS. 2 to 4 and may have various shapes. The shapes of extension portion 1210 and the electrode line 1220 of the first pad 1200 are not limited to the quadrangular shape in a plan view shown in FIG. 4.

Figure 15:
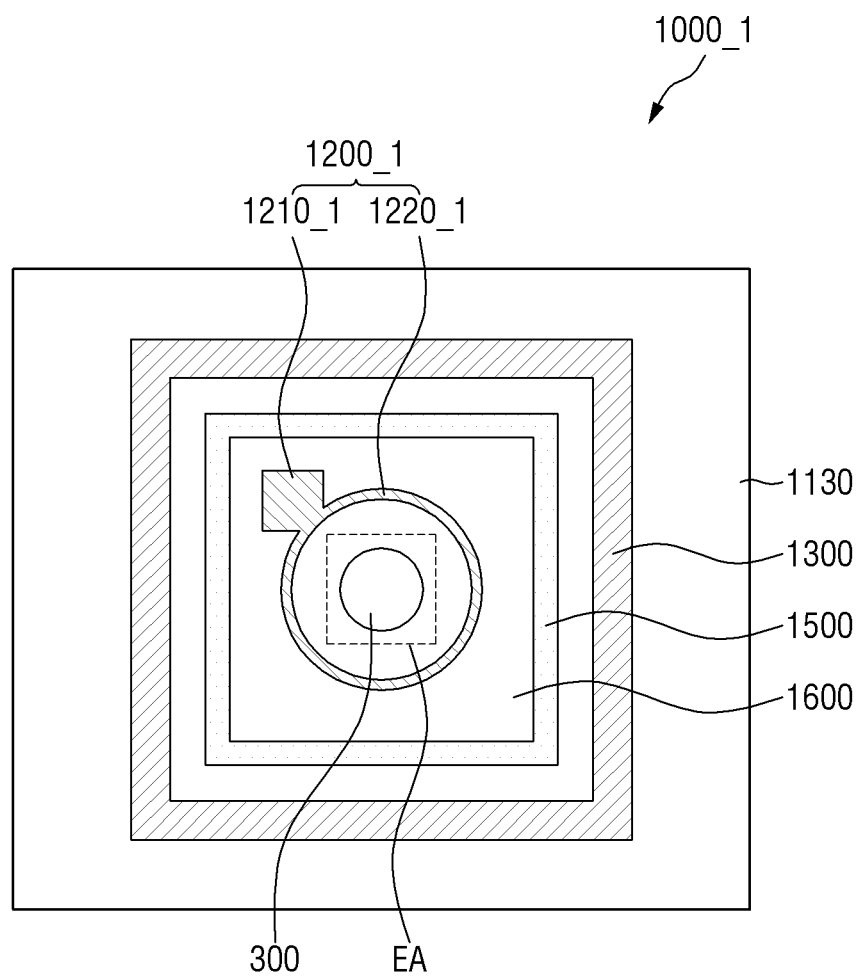
FIGS. 15 to 18 are schematic plan views of light-emitting element structures according to other embodiments.

First, referring to FIG. 15, in a light-emitting element structure 1000_1 according to an embodiment, an electrode line 1220_1 of a first pad 1200_1 may surround a first area EA in a circular shape. The electrode line 1220_1 directly contacting an extension portion 1210_1 may be disposed around an area overlapping a light-emitting element 300 in the first area EA. The electrode line 1220_1 may surround an outer periphery of the light-emitting element 300 in a circular shape with respect to a center of the light-emitting element 300. Accordingly, a boundary between the first area EA and a second area NEA separated by the electrode line 1220_1 of the first pad 1200_1 may have a circular shape.

The electrode line 1220_1 of FIG. 15 is illustrated as extending in a straight line from a center of the extension portion 1210_1. However, since the shape of the electrode line 1220_1 is a circular shape, each side of the electrode line 1220_1 may not be placed on a straight line with the center of the extension portion 1210_1 and may be formed to be curved with a predetermined curvature.

Figure 16:
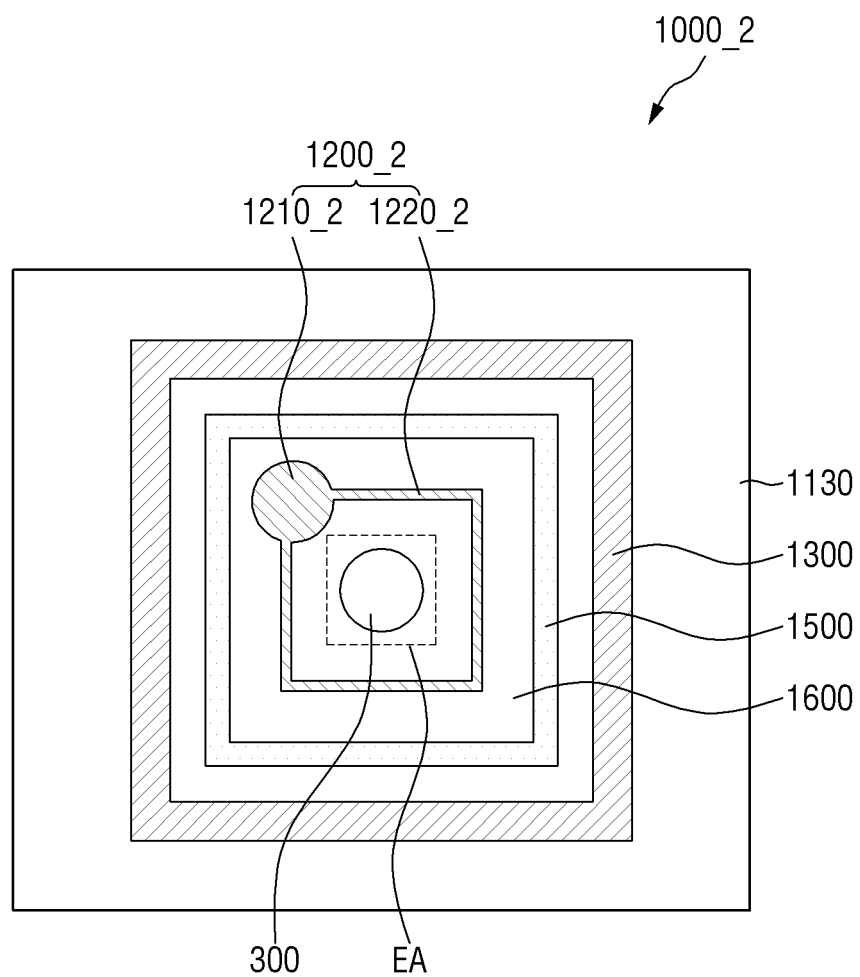

Referring to FIG. 16, in a light-emitting element structure 1000_2 according to an embodiment, an extension portion 1210_2 of a first pad 1200_2, which is electrically connected an electrode line 1220_2, may have a circular shape in a plan view. The shape of the extension portion 1210_2 is not particularly limited. In FIG. 16, although the extension portion 1210_2 is illustrated as having a circular shape, the extension portion 1210_2 may have other shapes. According to a method of forming the extension portion 1210_2, the extension portion 1210_2 may have various shapes. The shape of the extension portion 1210_2 is not particularly limited as long as the extension portion 1210_2 electrically contacts an external power source to be able to transmit a predetermined electrical signal.

Figure 17:
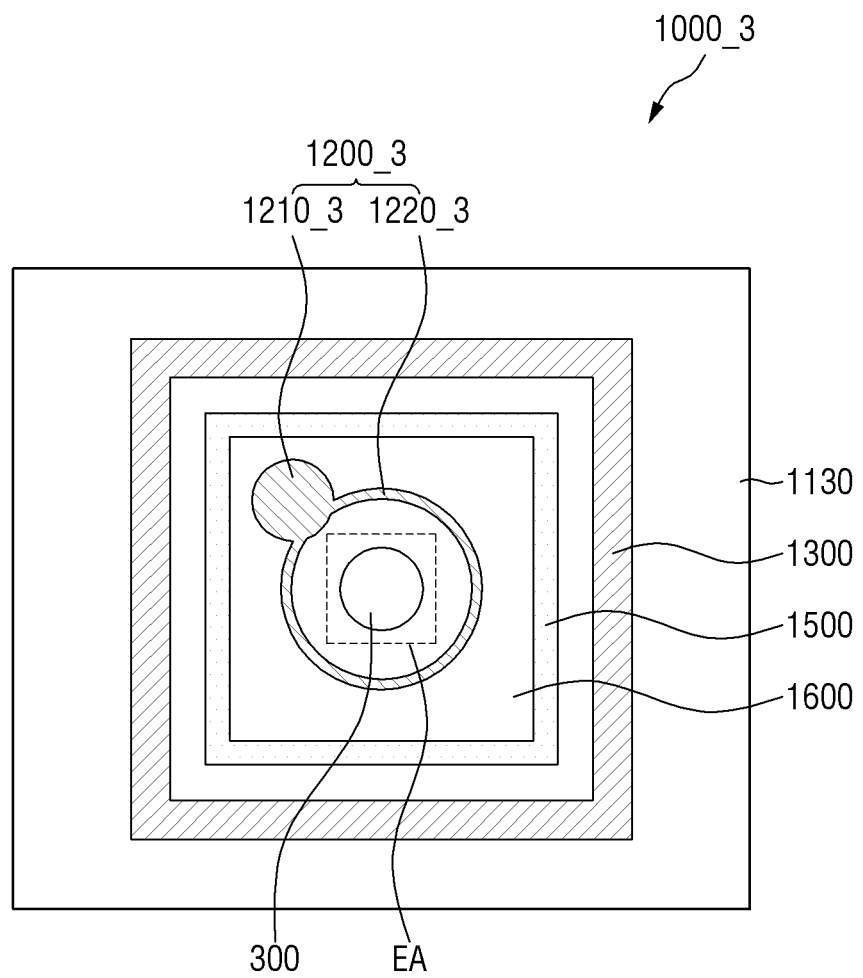

Referring to FIG. 17, in a light-emitting element structure 1000_3 according to an embodiment, an extension portion 1210_3 and an electrode line 1220_3 of a first pad 1200_3 may have a circular shape. The descriptions of the structures thereof are identical to those described with reference to FIGS. 15 and 16. Detailed descriptions thereof will be omitted.

As described above, the lower substrate 1100 of the light-emitting element structure 1000 may also have a circular structure in a plan view. Accordingly, the auxiliary layer 1500, the current spreading layer 1600, and the second pad 1300 disposed on the lower substrate 1100 may also have a circular structure in a plan view.

Figure 18:
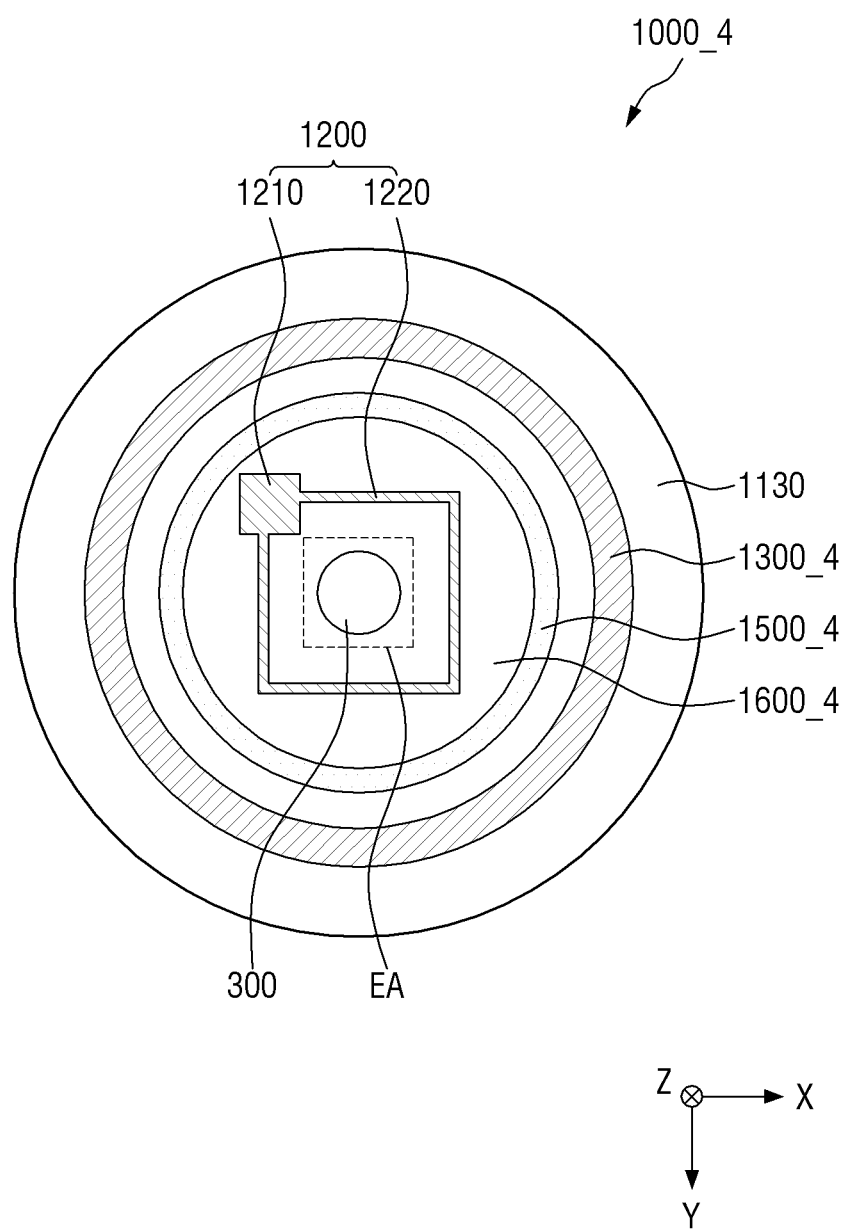

Referring to FIG. 18, a lower substrate 1100_4, an auxiliary layer 1500_4, and a current spreading layer 1600_4 of a light-emitting element structure 1000 are illustrated as having a circular structure in a plan view. A second pad 1300_4 may also be disposed to surround an outer peripheral surface of the auxiliary layer 1500_4 in a circular structure.

Figure 19:
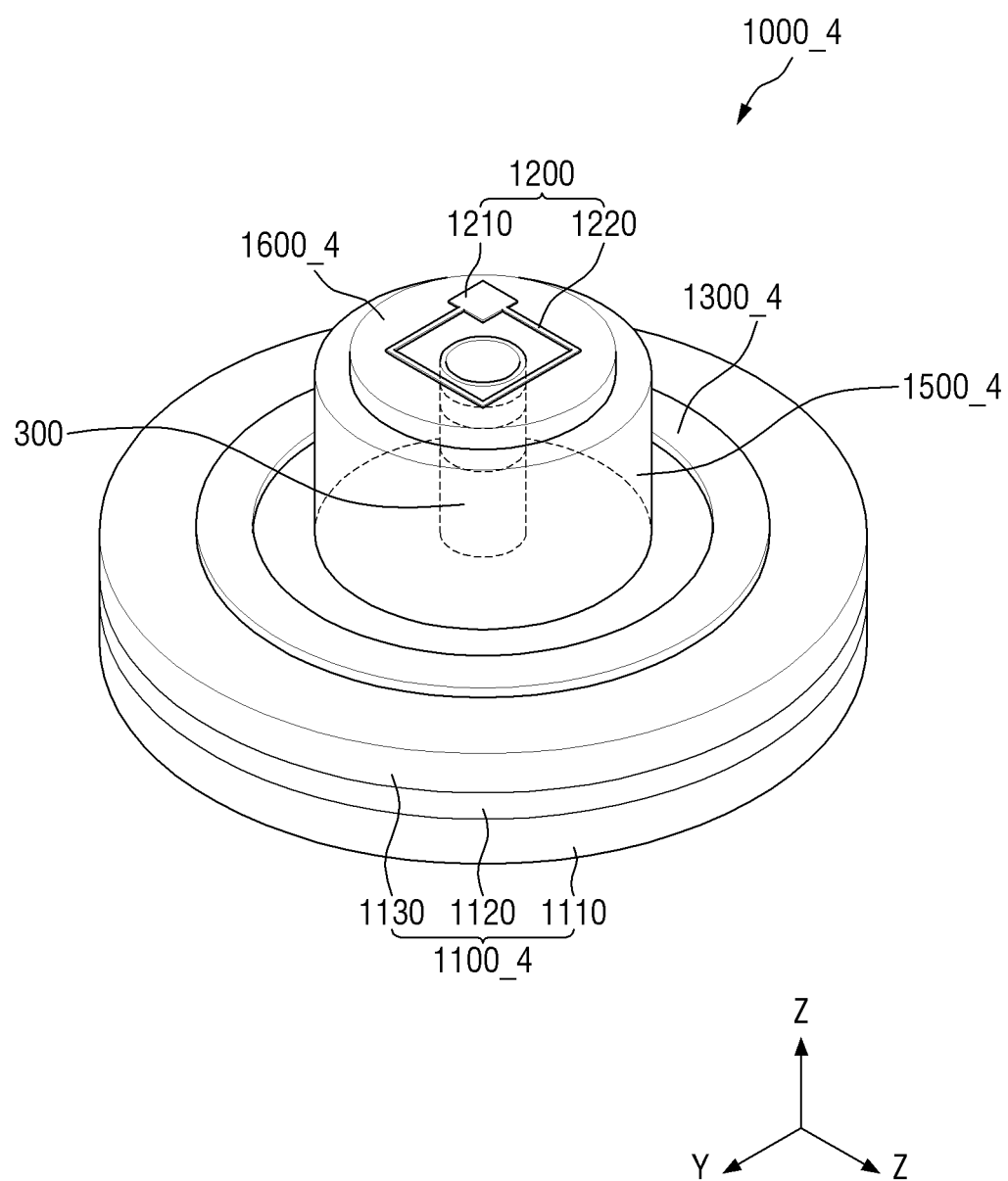
FIG. 19 is a schematic perspective view illustrating the light-emitting element structure of FIG. 18.

FIG. 19 is a schematic perspective view illustrating the light-emitting element structure of FIG. 18.

In an embodiment, in case that the lower substrate 1100_4 is a wafer substrate having a circular shape, members in a light-emitting element structure 1000_4 may have a curved shape with a predetermined curvature. Unlike the light-emitting element structure 1000 of FIG. 2, it can be seen in the light-emitting element structure 1000_4 of FIG. 19 that the lower substrate 1100_4, the auxiliary layer 1500_4, and the current spreading layer 1600_4 have a cylindrical shape. The second pad 1300_4 may surround an outer surface of the cylindrical auxiliary layer 1500_4. Therefore, the second pad 1300_4 may have a thickness, and a central portion thereof may have an empty columnar or circular shape.

However, the disclosure is not limited thereto. Even in case that the lower substrate 1100_4 of the light-emitting element structure 1000_4 is a circular wafer substrate, the auxiliary layer 1500_4 and the current spreading layer 1600_4 may have a quadrangular or polygonal shape in a plan view.

Figure 20:
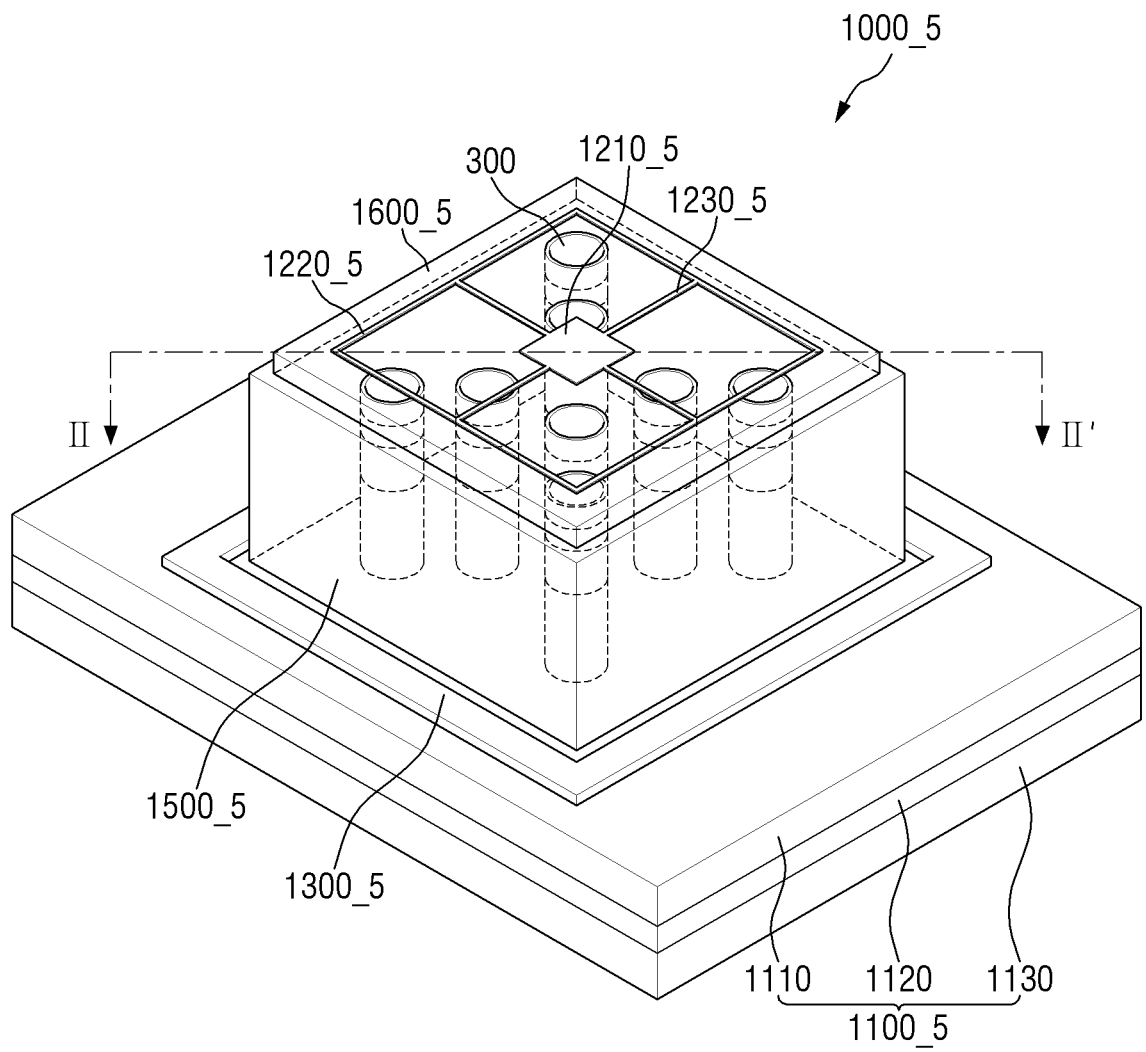
FIG. 20 is a schematic perspective view illustrating a light-emitting element structure according to still another embodiment.
Figure 21:
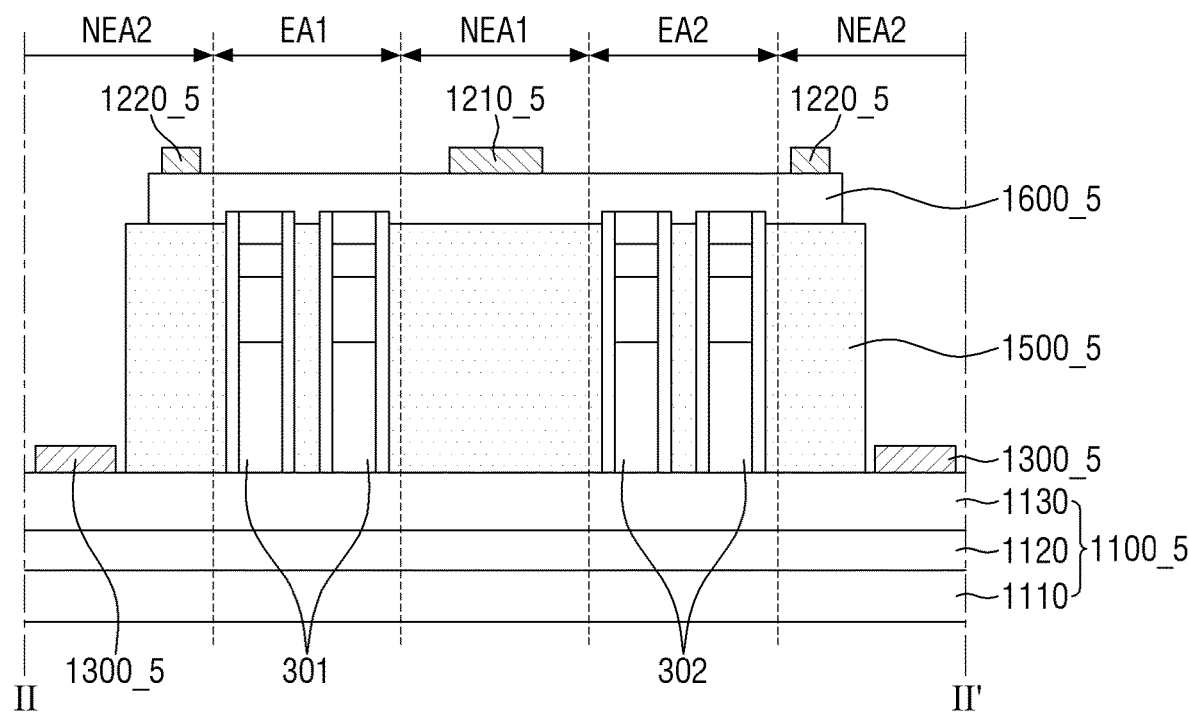
FIG. 21 is a schematic cross-sectional view taken along line II-II' of FIG. 20.
Figure 22:
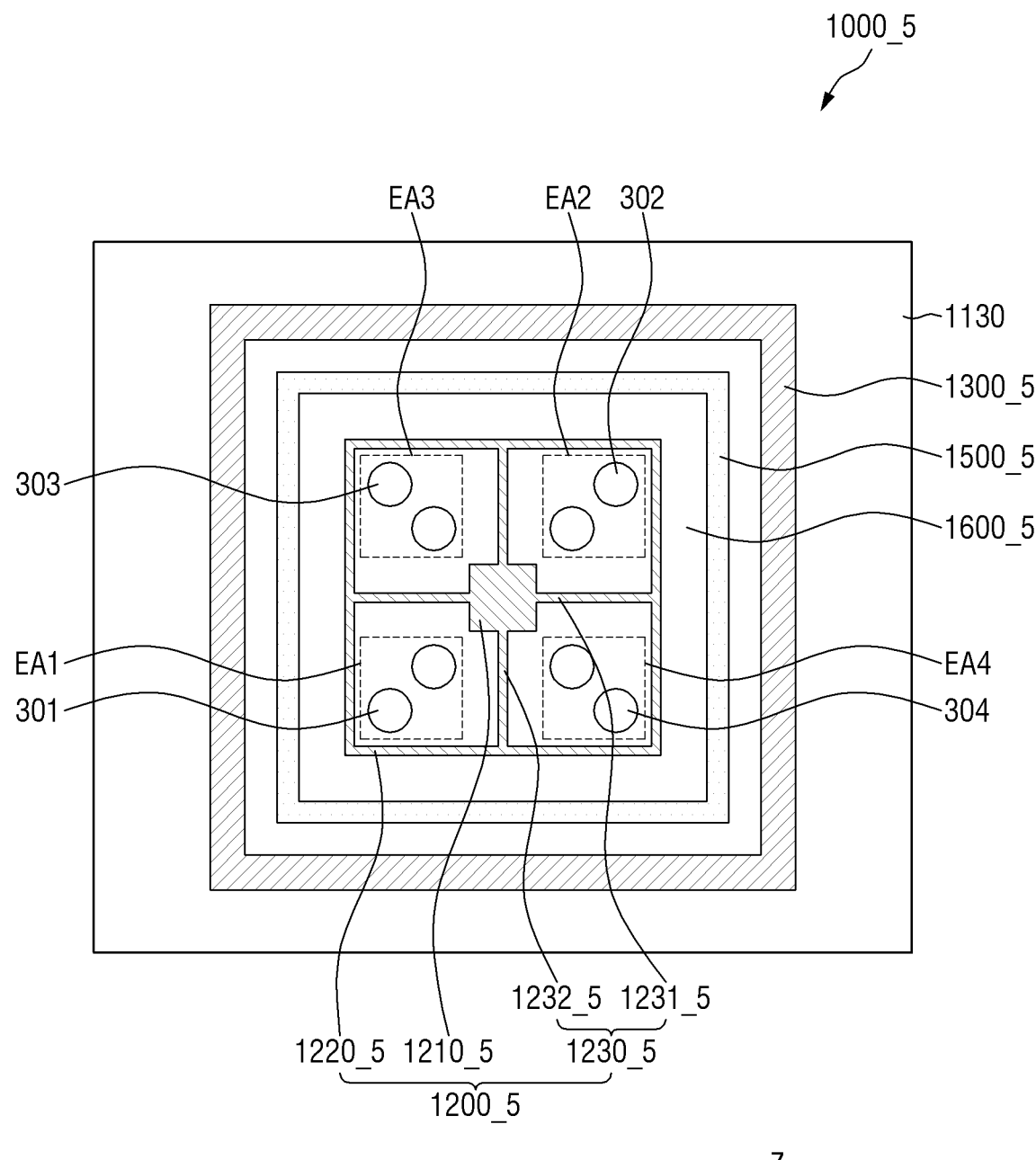
FIG. 22 is a schematic plan view of the light-emitting element structure of FIG. 20 viewed from above.

FIG. 20 is a schematic perspective view illustrating a light-emitting element structure according to still another embodiment. FIG. 21 is a schematic cross-sectional view taken along line II-II' of FIG. 20. FIG. 22 is a schematic plan view of the light-emitting element structure of FIG. 20 viewed from above.

As described above, the light-emitting element structure 1000 may include one or more light-emitting elements 300. The light-emitting elements 300 may include light-emitting elements disposed relatively adjacent to each other and light-emitting elements spaced apart from each other at a wide interval. Accordingly, the light-emitting element structure 1000 may include more first areas EA and more second areas NEA. FIG. 3 illustrates that the second areas NEA are disposed at both sides of a first area EA in a cross section. Accordingly, a first area EA may be defined in the auxiliary layer 1500, and the first pad 1200 may not overlap the light-emitting element 300 in the first area EA.

In contrast, in case that the light-emitting elements 300 are provided, one or more first areas EA may be defined in the auxiliary layer 1500, and the second areas NEA positioned between the first areas EA may be further defined. Accordingly, the first pad 1200 may be disposed in the second area NEA so as to have a structure different from that of FIGS. 2 to 4.

Referring to FIGS. 20 to 22, a light-emitting element structure 1000 5 according to the embodiment may include light-emitting elements 300 and thus include more first areas EA and more second areas NEA. The light-emitting element structure 1000_5 of FIG. 20 may be identical to the light-emitting element structure 1000 of FIG. 2 except that structures of the first area EA, the second area NEA, and a first pad 1200_5 are different from those of the light-emitting element structure 1000. Hereinafter, repetitive descriptions will be omitted, and differences will be described.

The light-emitting elements 300 may be spaced apart from each other. As the light-emitting elements 300, one or more first light-emitting elements 301 disposed relatively adjacent to each other and one or more second light-emitting elements 302 spaced apart from the first light-emitting elements 301 at a relatively wide interval may be defined.

In FIG. 20, the first light-emitting elements 301, the second light-emitting elements 302, third light-emitting elements 303, and fourth light-emitting elements 304 are illustrated as being defined as the light-emitting elements 300. The first to fourth light-emitting elements 301, 302, 303, and 304 may be disposed on a lower substrate 1100_5 and be spaced apart from each other. The first to fourth light-emitting elements 301, 302, 303, and 304 may be spaced apart from each other in a first direction (for example, an X-axis direction) and a second direction (for example, a Y-axis direction) in a plan view. The first to fourth light-emitting elements 301, 302, 303, and 304 may form a quadrangular structure in a plan view. However, the disclosure is not limited thereto, and more light-emitting elements may be defined. The arrangement structure of the first to fourth light-emitting elements 301, 302, 303, and 304 is not limited to that shown in FIG. 20.

In FIG. 21, for convenience of description, the first light-emitting element 301 and the second light-emitting element 302 will be illustrated and described in a cross section. In particular, only the first light-emitting element 301 and the second light-emitting element 302 will be illustrated and described in a cross section taken along line II-II' of FIG. 20.

Each of the first light-emitting elements 301 and the second light-emitting elements 302 may be in a first area EA. As shown in FIG. 21, the light-emitting element structure 1000_5 may include first areas EA and second areas NEA in a cross section. The first light-emitting elements 301 and the second light-emitting elements 302 may be spaced apart from each other at a predetermined interval and may form a 1-1-th area EA1 and a 1-2-th area EA2, respectively. The 1-1-th area EA1 and the 1-2-th area EA2 may be spaced apart from each other, and a 2-1-th area NEA1 may be disposed in an area therebetween. The second area NEA may include the 2-1-th area NEA1 between the 1-1-th area EA1 and the 1-2-th area EA2 and a 2-2-th area NEA2 positioned at an outer periphery of each of the 1-1-th area EA1 and the 1-2-th area EA2.

Although not shown in FIG. 21, the third light-emitting elements 303 and the fourth light-emitting elements 304 may form a 1-3-th area EA3 and a 1-4-th area EA4, respectively. As shown in FIG. 22, the first area EA may include the 1-1-th area EA1, the 1-2-th area EA2, the 1-3-th area EA3, and the 1-4-th area EA4 and may be defined on the light-emitting element structure 1000_5. The 1-1-th to 1-4-th areas EA1, EA2, EA3, and EA4 may be spaced apart from each other in the first direction (for example, the X-axis direction) and the second direction (for example, the Y-axis direction) may form a quadrangular structure in a plan view. However, the disclosure is not limited thereto.

An auxiliary layer 1500_5 may surround outer peripheral surfaces of the first light-emitting elements 301 and the second light-emitting elements 302, and a current spreading layer 1600_5 may cover or overlap ends of the first light-emitting element 301 and the second light-emitting element 302 which protrude from the auxiliary layer 1500_5. The arrangements or structures of the auxiliary layer 1500_5 and the current spreading layer 1600_5 may be identical to those described above.

FIG. 21 illustrates the structures of the first area EA and the second area NEA in a cross section of the light-emitting element structure 1000_5. As described above, although not shown in the drawings, the first area EA may be defined to be surrounded by the second area NEA in a perspective view of the light-emitting element structure 1000_5. The 2-1-th area NEA1 and the 2-2-th area NEA2 may surround and separate the 1-1-th to 1-4-th areas EA1 to EA4.

Accordingly, the auxiliary layer 1500_5 and the current spreading layer 1600_5 on which a first pad 1200_5 is disposed, may be disposed in the second-first area NEA1 and a portion of the second-second area NEA2 may be disposed. A second pad 1300_5 may be disposed in the 2-2-th area NEA2 of the second area NEA, which is an area in which the lower substrate 1100_5 is exposed by the auxiliary layer 1500_5.

Referring to FIG. 22, the second pad 1300_5 may be disposed on a sub-semiconductor layer 1130 of the lower substrate 1100_5 exposed at an outer periphery of the auxiliary layer 1500_5. The second pad 1300_5 may be disposed in the 2-2-th area NEA2. Since the structure of the second pad 1300_5 is identical to that described above, detailed descriptions thereof will be omitted.

The first pad 1200_5 may include an extension portion 1210_5 which a probe of an external power source electrically contacts. The structure or shape of the extension portion 1210 5 may be identical to that described above with reference to FIG. 4. However, unlike the light-emitting element structure 1000 shown in FIG. 4, the first pad 1200_5 of the light-emitting element structure 1000_5 according to the embodiment may include the extension portion 1210_5 which is disposed in the 2-1-th area NEA1 formed by the first area EA, for example, the 1-1-th to 1-4-th areas EA1 to EA4 being spaced apart from each other, an electrode line 1220_5 which is spaced apart from the extension portion 1210_5 and is disposed in the 2-2-th area NEA2, and a connection portion 1230_5 which electrically connects the extension portion 1210_5 and the electrode line 1220_5.

The first pad 1200_5 of the light-emitting element structure 1000_5 may include the extension portion 1210 5 and the electrode line 1220 5 and may further include the connection portion 1230_5 connecting the extension portion 1210_5 and the electrode line 1220_5. The extension portion 1210_5 may be disposed at a central portion of the 2-1-th area NEA1 formed by the 1-1-th to 1-4-th areas EA1 to EA4 disposed on the current spreading layer 1600_5 to be spaced apart from each other.

For example, as shown in the drawing, the 2-1-th area NEA1 may include areas extending and intersecting each other in the first direction (for example, the X-axis direction) and the second direction (for example, the Y-axis direction). The extension portion 1210_5 may not overlap the light-emitting elements 300 at the central portion of the 2-1-th area NEA1 at which the areas intersect each other. The first to fourth light-emitting elements 301, 302, 303, and 304 may be disposed symmetrically with each other based on the extension portion 1210_5, and thus, the 1-1-th to 1-4-th areas EA1 to EA4 may also be disposed symmetrically. For example, the 1-1-th to 1-4-th areas EA1 to EA4 may be formed in a grid shape. However, the disclosure is not limited thereto.

Unlike that shown in FIG. 4, the electrode line 1220_5 may not directly contact the extension portion 1210_5 and may be spaced apart from the extension portion 1210_5. The electrode line 1220_5 may be disposed in the 2-2-th area NEA2 disposed at the outer surface of the auxiliary layer 1500_5. Since the 2-2-th area NEA2 surrounds the 1-1-th to 1-4-th areas EA1 to EA4, the electrode line 1220_5 may not overlap the light-emitting elements 300 and surround the light-emitting elements 300. Therefore, an electrical current transmitted through the extension portion 1210_5 may be uniformly transmitted to the current spreading layer 1600_5 in the 1-1-th to 1-4-th areas EA1 to EA4. The shape of the electrode line 1220_5 may be identical to that of FIG. 4 except that the electrode line 1220_5 is spaced apart from the extension portion 1210_5 and does not directly contact the extension portion 1210_5. For example, the electrode line 1220_5 may have a predetermined width and a quadrangular shape in a plan view, but the disclosure is not limited thereto.

The connection portion 1230_5 may electrically connect the extension portion 1210_5 to the electrode line 1220_5 which are spaced apart from each other. For example, the connection portion 1230_5 may directly contact the extension portion 1210_5 and the electrode line 1220_5. The connection portion 1230_5 may include portions which branch off from the extension portion 1210_5 and extend in the first direction (for example, the X-axis direction) and the second direction (for example, the Y-axis direction). For example, the connection portion 1230_5 may include a first connection portion 1231_5 extending in the first direction (for example, the X-axis direction) and a second connection portion 1232_5 extending in the second direction (for example, the Y-axis direction). Both ends of the first connection portion 1231_5 and the second connection portion 1232_5 may electrically contact the electrode line 1220_5. As shown in the drawing, the first connection portion 1231_5 and the second connection portion 1232_5 may have shapes which branch off from the extension portion 1210 5 and intersect each other. However, the disclosure is not limited thereto.

The first connection portion 1231_5 and the second connection portion 1232_5 may be disposed in the 2-1-th area NEA1. Unlike the extension portion 1210_5, the connection portion 1230_5 may be disposed in the 2-1-th area NEA1 positioned between the first areas EA spaced apart from each other. Accordingly, the 1-1-th to 1-4-th areas EA1 to EA4 may be substantially separated by the first connection portion 1231_5 and the second connection portion 1232_5.

FIGS. 20 to 22 illustrate that the four light-emitting elements 300 are spaced apart from each other, and thus, the first pad 1200_5 may form the structure as described above. However, the disclosure is not limited thereto, and in case that the light-emitting element structure 1000 includes more light-emitting elements 300, the arrangement of the first pad 1200_5 may be changed.

Due to the structure of the first pad 1200_5 in which the first pad 1200_5 does not overlap the light-emitting elements 300, the electrical and optical characteristics of the light-emitting element 300 may be accurately measured. Since the first pad 1200_5 includes the extension portion 1210_5, the electrode line 1220_5, and the connection portion 1230_5, an electrical signal may be uniformly transmitted to an electrode layer 370 of each light-emitting element 300 through the current spreading layer 1600_5. The connection portion 1230_5 of the first pad 1200_5 may separate the first areas EA, which are areas substantially overlapping the light-emitting elements 300, and the electrode line 1220_5 may separate the first area EA and the 2-2-th area NEA2 surrounding the light-emitting elements 300.

The structures of the first area EA, the second area NEA, and the first pad 1200_5 of the light-emitting element structure 1000_5 may be changed according to a structure in which nanopatterns of an etching pattern layer 2700 are disposed in case that the light-emitting element 300 is manufactured. In case that the light-emitting element structure 1000 of FIG. 2 is manufactured, it can be seen that the etching pattern layer 2700 includes a nanopattern to form a light-emitting element 300, as shown in FIG. 8. In contrast, in case that the light-emitting element structure 1000_5 of FIGS. 20 to 22 is manufactured, an etching pattern layer 2700 including one or more nanopatterns 2710 and 2720 may be formed. Accordingly, in the light-emitting element structure 1000_5, it is possible to form the light-emitting elements 300, for example, the first light-emitting elements 301 and the second light-emitting elements 302, which are spaced apart from each other at different intervals.

FIGS. 23 to 26 are schematic cross-sectional views illustrating a method of manufacturing the light-emitting element structure of FIG. 20. Hereinafter, in a method of manufacturing a light-emitting element structure 1000_5, descriptions of contents overlapping the contents described above will be omitted.

Figure 23:
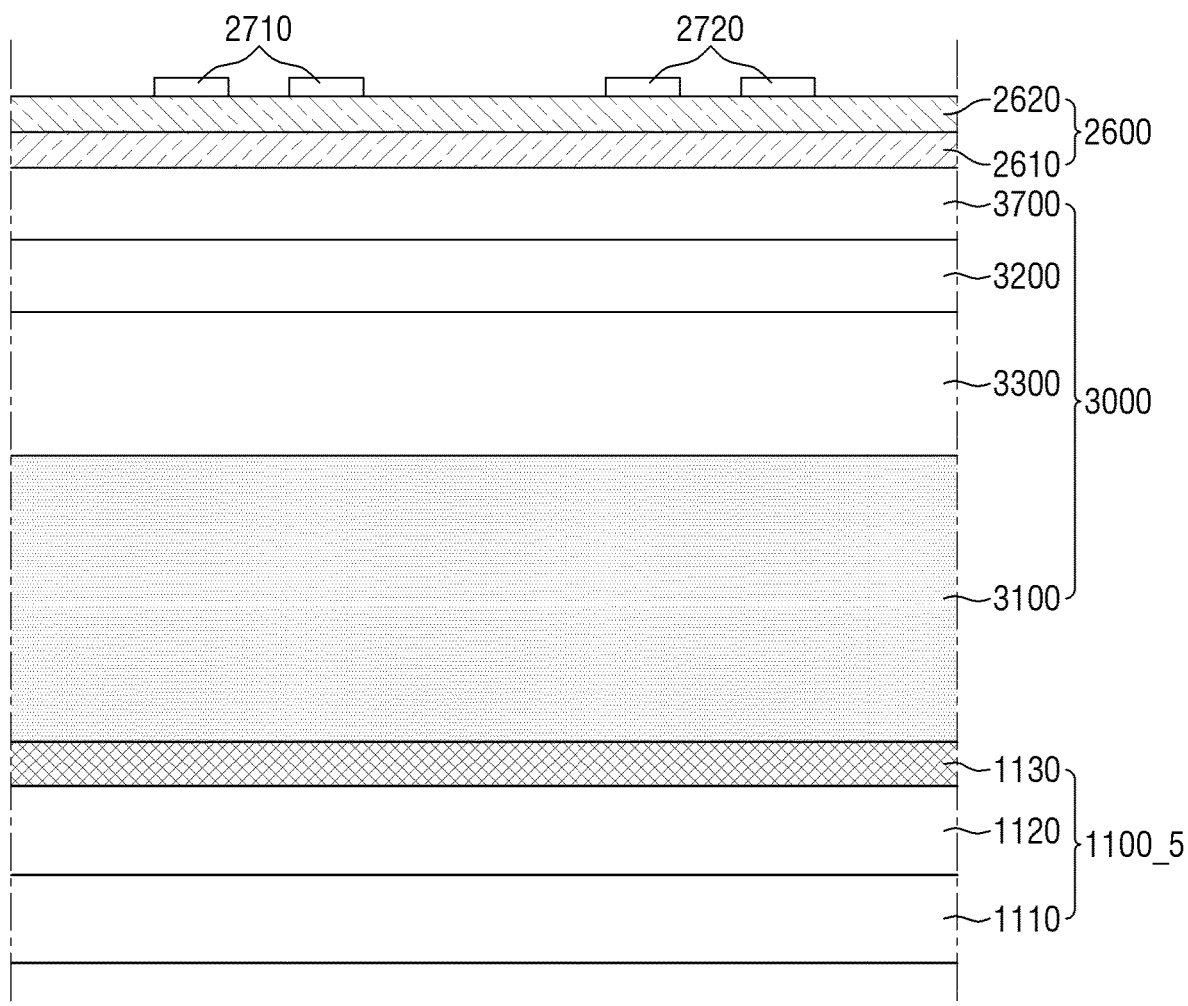
FIGS. 23 to 26 are schematic cross-sectional views illustrating a method of manufacturing the light-emitting element structure of FIG. 20.

First, referring to FIG. 23, in order to etch a semiconductor structure 3000 in a direction perpendicular to a lower substrate 1100_5, an etching pattern layer 2700 disposed on an etching mask layer 2600 may include nanopatterns 2710 and 2720. The nanopatterns 2710 and 2720 may be spaced apart from each other and may include first nanopatterns 2710 and second nanopatterns 2720 which are spaced apart from each other at a relatively wide interval.

Each of the first nanopattern 2710 and the second nanopattern 2720 may include nanopatterns spaced apart from each other. As shown in the drawing, among the nanopatterns included in the etching pattern layer 2700, the nanopatterns disposed partially adjacent to each other may form the first nanopattern 2710 and the second nanopattern 2720. In contrast, an interval between the first nanopattern 2710 and the second nanopattern 2720 may be wider than that between the nanopatterns. Accordingly, the semiconductor structure 3000 may be etched at different intervals along the first nanopattern 2710 and the second nanopattern 2720.

Figure 24:
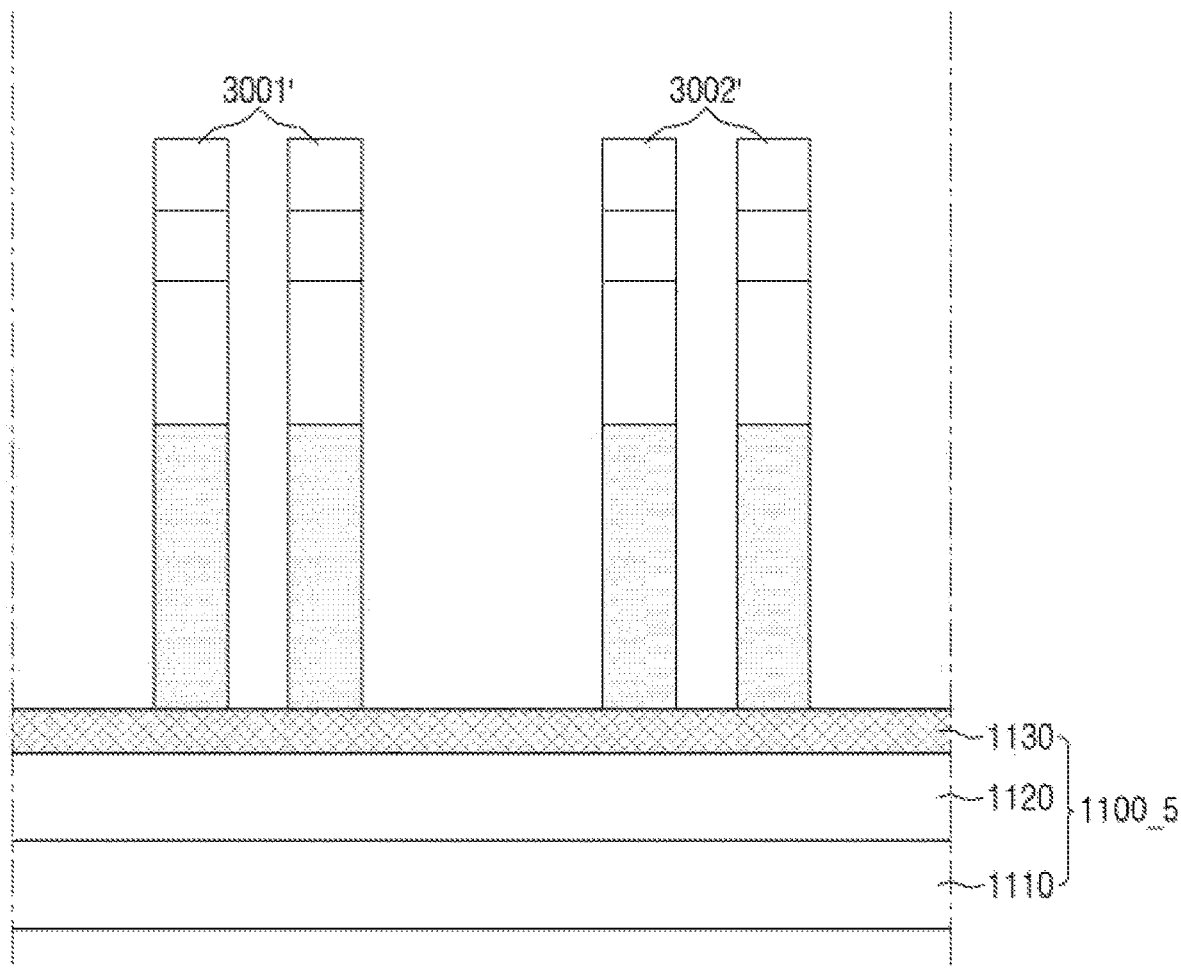
Figure 25:
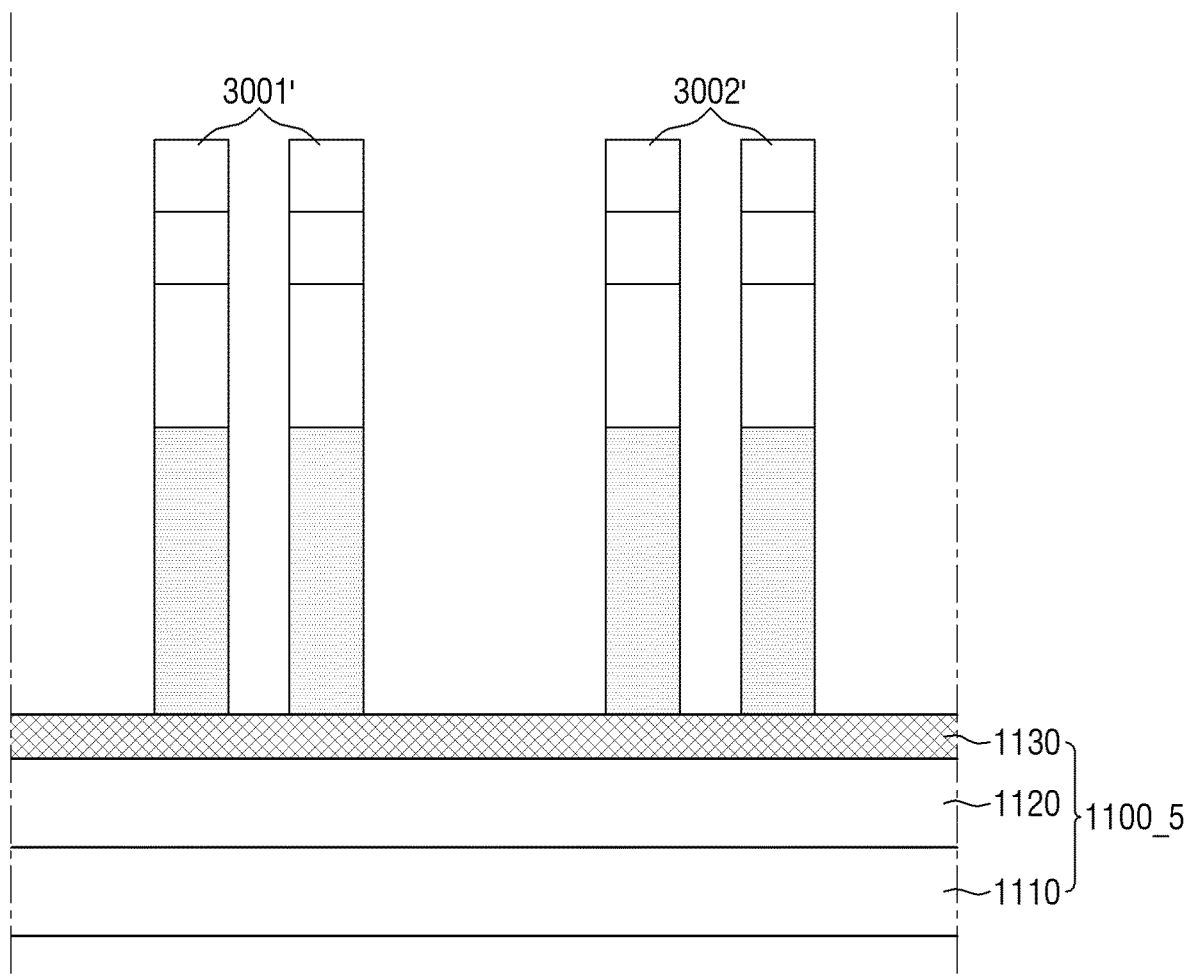

Referring to FIGS. 24 and 25, in case that the semiconductor structure 3000 is etched along the first nanopattern 2710 and the second nanopattern 2720, a first semiconductor crystal 3001' and a second semiconductor crystal 3002' may be formed. An insulating film 380 may be formed to surround an outer peripheral surface of each of the first semiconductor crystal 3001' and the second semiconductor crystal 3002', thereby forming first-light-emitting elements 301 and second light-emitting elements 302.

Figure 26:
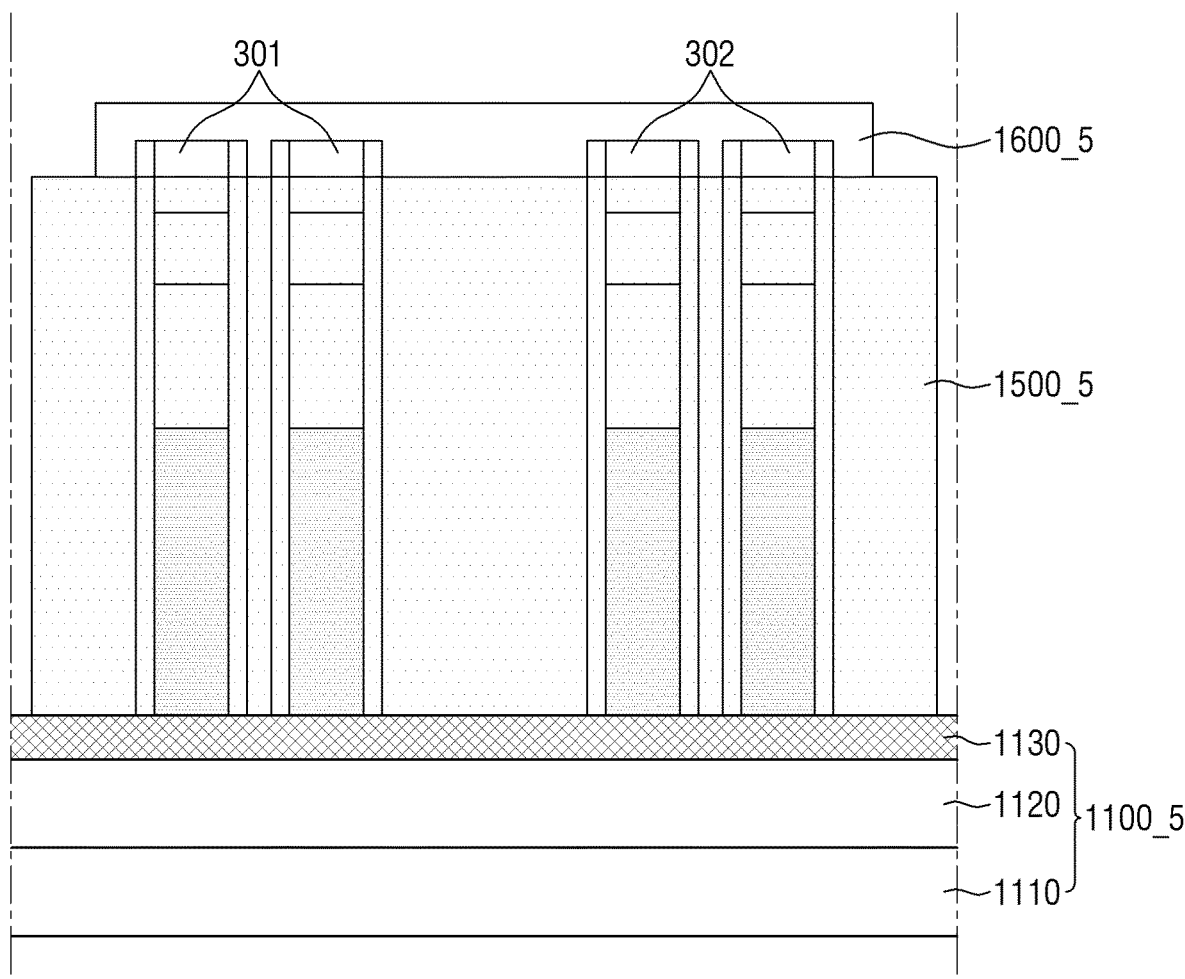

Referring to FIG. 26, an auxiliary layer 1500_5 and a current spreading layer 1600_5 may be formed on the lower substrate 1100_5. As shown in the drawing, the auxiliary layer 1500_5 may be formed to surround the first light-emitting element 301 and the second light-emitting element 302, and the current spreading layer 1600_5 may cover or overlap ends of the first light-emitting element 301 and the second light-emitting element 302. Accordingly, the light-emitting element structure 1000_5 may include first areas EA, for example, a 1-1-th area EA1 and a 1-2-th area EA2, and second areas NEA, for example, a 2-1-th area NEA1 and a 2-2-th area NEA2. Subsequent operations are identical to those described above. Detailed descriptions of structures of a first pad 1200_5 and a second pad 1300_5 will be omitted.

Figure 27:
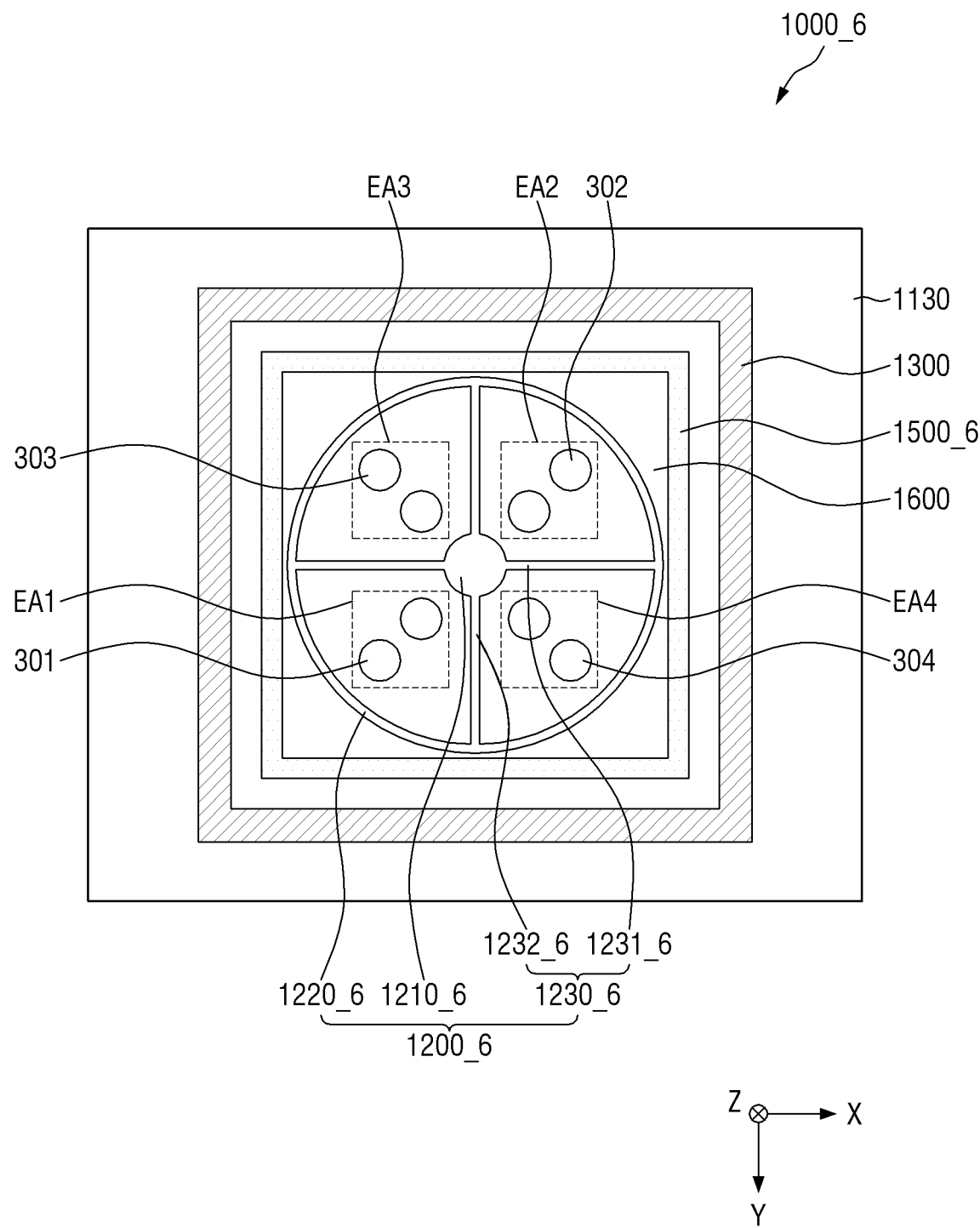
FIG. 27 is a schematic plan view of a light-emitting element structure according to yet another embodiment.

FIG. 27 is a schematic plan view of a light-emitting element structure according to yet another embodiment.

Referring to FIG. 27, a light-emitting element structure 1000_6 may include light-emitting elements 300, for example, first light-emitting elements 301 and second light-emitting element 302. A first pad 1200_6 may include an extension portion 1210_6 which has a circular shape, an electrode line 1220_6 which is spaced apart from the extension portion 1210_6 and has a substantially identical shape to the extension portion 1210_6, and a connection portion 1230_6 which connects the extension portion 1210_6 to the electrode line 1220_6.

A structure in which the extension portion 1210_6 and the electrode line 1220_6 each have a circular shape may be identical to that described above with reference to FIG. 17. The connection portion 1230_6 of the first pad 1200_6 may include a first connection portion 1231_6 and a second connection portion 1232_6 which branch off from the extension portion 1210_6 and extend from a center of the extension portion 1210_6 in a first direction (for example, an X-axis direction) and a second direction (for example, a Y-axis direction). The extension portion 1210_6 of the first pad 1200_6 may be disposed in a 2-1-th area NEA1 positioned at a central portion of an auxiliary layer 1500_6, and the electrode line 1220_6 may be disposed in a 2-2-th area NEA2 positioned at an outer side of the auxiliary layer 1500_6. The connection portion 1230_6 may be disposed in a 2-1-th area NEA1 in which first areas EA, for example, 1-1-th to 1-4-th areas EA1 to EA4, are spaced apart from each other. The connection portion 1230_6 may separate the 1-1-th to 1-4-th areas EA1 to EA4 from each other. Accordingly, the first connection portion 1231_6 and the second connection portion 1232_6 may intersect each other at the extension portion 1210_6, and both ends thereof may electrically contact the electrode line 1220_6. Accordingly, the extension portion 1210_6 and the electrode line 1220_6 may be electrically connected to each other by the connection portion 1230_6.

As described above, the light-emitting element structure 1000 may include the light-emitting element 300 and may include the first pad 1200 and the second pad 1300 not overlapping the light-emitting element 300. The light-emitting element structure 1000 may prevent the electrical and optical characteristics of the light-emitting element 300 from being blocked by other members and may accurately measure the electrical and optical characteristics of the light-emitting element 300. As described above, the light-emitting element 300 may be included in the display device 10 to emit light having a specific wavelength by an electrical signal that is transmitted from an electrode. Hereinafter, the display device 10 will be described.

Figure 28:
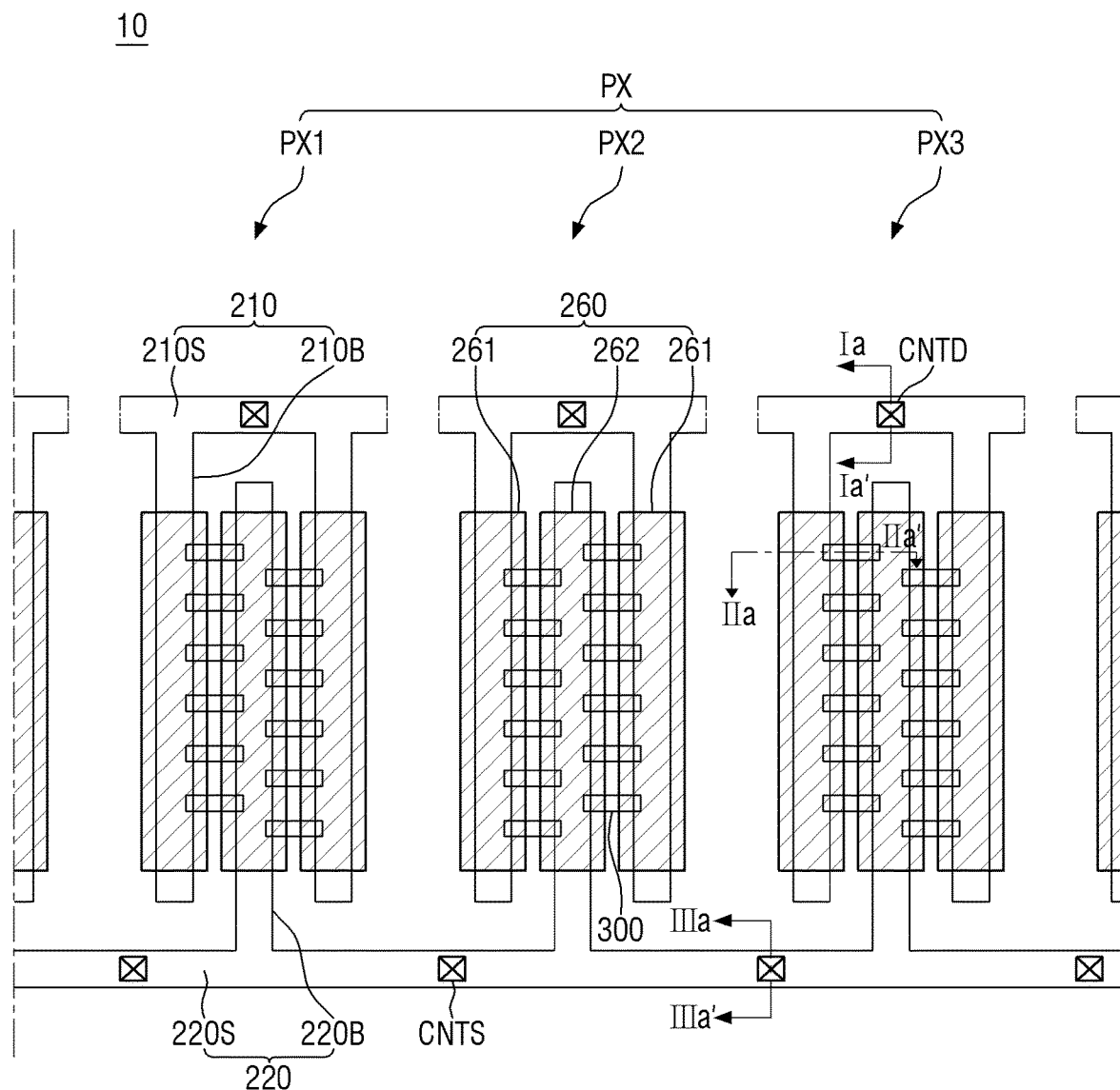
FIG. 28 is a schematic plan view of a display device according to an embodiment.

FIG. 28 is a schematic plan view of a display device according to an embodiment.

Referring to FIG. 28, a display device 10 may include one or more areas defined as pixels PXn (where n is a natural number). Each of the pixels PXn may emit light having a specific wavelength from the outside of the display device 10. FIG. 28 illustrates, as an example, three pixels PX1, PX2, and PX3, but the display device 10 may include more pixels PXn.

Although not shown in the drawings, the display device 10 may include a display area and a non-display area. The pixels PXn may be disposed in the display area, and electrodes 210 and 220 and light-emitting elements 300 therebetween may be aligned in each pixel PXn. Accordingly, in the display area, the light-emitting element 300 may display light of a specific color to the outside of the display device 10.

The non-display area may be defined as an area, in which the pixels PXn are not disposed, other than the display area in the display device 10. Various members for driving the light-emitting element 300 disposed in the display area may be disposed in the non-display area. As an example, in the non-display area of the display device 10, lines, a circuit unit, a driver, and the like for applying an electrical signal to the display area may be disposed, but the disclosure is not limited thereto.

The pixels PXn may include the electrodes 210 and 220 and one or more light-emitting elements 300 emitting light having a specific wavelength to display colors.

In an embodiment, the pixels PXn displaying different colors may each include light-emitting elements 300 emitting light of a different color. For example, a first pixel PX1 may include light-emitting elements 300 configured to emit red light, a second pixel PX2 may include light-emitting elements 300 configured to emit green light, and a third pixel PX3 may include light-emitting elements 300 configured to emit blue light. However, the disclosure is not limited thereto.

The electrodes 210 and 220 may include a first electrode 210 and a second electrode 220. In an embodiment, the first electrode 210 may be a pixel electrode separated for each pixel PXn, and the second electrode 220 may be a common electrode connected in common along the pixels PXn. One of the first electrode 210 and the second electrode 220 may be an anode of the light-emitting element 300, and the other thereof may be a cathode of the light-emitting element 300. However, the disclosure is not limited thereto, and the reverse may well be the case.

The first electrode 210 and the second electrode 220 may include electrode stem portions 210S and 220S which extend in a first direction D1 and one or more electrode branch portions 210B and 220B which branch off from the electrode stem portions 210S and 220S and extend in a second direction D2 that is a direction intersecting the first direction D1, respectively.

Specifically, the first electrode 210 may include a first electrode stem portion 210S which extends in the first direction D1 and one or more first electrode branch portions 210B which branch off from the first electrode stem portion 210S and extend in the second direction D2. An end of the first electrode stem portion 210S may be connected to a signal applying pad (not shown), and another end thereof may extend in the first direction D1 and may be electrically disconnected between the pixels PXn.

Both ends of the first electrode stem portion 210S of an arbitrary pixel PXn may be spaced apart from adjacent pixels PXn and terminated between the pixels PXn. The first electrode stem portion 210S may be disposed on a substantially identical extension line to the first electrode stem portion 210S of an adjacent pixel which belongs to the same row (for example, is adjacent thereto in the first direction D1). Accordingly, the first electrode stem portion 210S disposed in each pixel PXn may apply different electrical signals to the first electrode branch portions 210B.

The first electrode branch portion 210B may branch off from at least a portion of the first electrode stem portion 210S, may extend in the second direction D2, and may be terminated in a state of being spaced apart from the second electrode stem portion 220S disposed opposite to the first electrode stem portion 210S.

The second electrode 220 may include a second electrode stem portion 220S which extends in the first direction D1 and is spaced apart from and face the first electrode stem portion 210S and a second electrode branch portion 220B which branch off from the second electrode stem portion 220S and extends in the second direction D2. Similar to the first electrode stem portion 210S, an end of the second electrode stem portion 220S may also be electrically connected to the signal applying pad (not shown). However, the other end of the second portion 220S may extend to the adjacent pixels PXn in the first direction D1. Therefore, both ends of the second electrode stem portion 220S of an arbitrary pixel may be electrically connected to ends of the second electrode stem portions 220S of adjacent pixels between the pixels PXn.

The second electrode branch portion 220B may be spaced apart from and face the first electrode branch portion 210B and may be terminated in a state of being spaced apart from the first electrode stem portion 210S. For example, an end of the second electrode branch portion 220B may be electrically connected to the second electrode stem portion 220S, and the other end thereof may be disposed in the pixel PXn in a state of being spaced apart from the first electrode stem portion 210S.

FIG. 28 illustrates that two first electrode branch portions 210B are provided and the second electrode branch portion 220B is disposed therebetween, but the disclosure is not limited thereto. Additional first and second electrode branch portions 210B and 220B may be provided.

The light-emitting elements 300 may be aligned between the first electrode branch portion 210B and the second electrode branch portion 220B. In at least some of the light-emitting elements 300, an end portion thereof may be electrically connected to the first electrode branch portion 210B, and the other end portion thereof may be electrically connected to the second electrode branch portion 220B.

Although not shown in FIG. 28, a first insulating layer 510 (see FIG. 29) may be disposed to partially overlap the first electrode branch portion 210B, the second electrode branch portion 220B, and a space therebetween. The first insulating layer 510 may protect each of the electrodes 210 and 220 and may insulate the electrodes 210 and 220 from each other such that the electrodes 210 and 220 do not directly contact each other.

A contact electrode 260 may be disposed on each of the first electrode branch portion 210B and the second electrode branch portion 220B. However, the contact electrode 260 may be substantially disposed on the first insulating layer 510 and may overlap the first electrode branch portion 210B and the second electrode branch portion 220B.

Contact electrodes 260 may extend in the second direction D2 and may be spaced apart from each other in the first direction D1. The contact electrode 260 may electrically contact at least one end portion of the light-emitting element 300. The contact electrode 260 may electrically contact the first electrode 210 or the second electrode 220 to receive an electrical signal. Accordingly, the contact electrode 260 may transmit an electrical signal transmitted from each of the electrodes 210 and 220 to the light-emitting element 300.

The contact electrode 260 may include a first contact electrode 261 and a second contact electrode 262 which are disposed on the electrode branch portions 210B and 220B to partially cover or overlap the electrode branch portions 210B and 220B and electrically contact an end portion or the other end portion of the light-emitting element 300.

The first contact electrode 261 may be disposed on the first electrode branch portion 210B and may electrically contact an end portion of the light-emitting element 300 which is electrically connected to the first electrode 210. The second contact electrode 262 may be disposed on the second electrode branch portion 220B and may electrically contact the other end portion of the light-emitting element 300 which is electrically connected to the second electrode 220.

As shown in FIG. 28, the first electrode stem portion 210S and the second electrode stem portion 220S may be electrically connected to a thin film transistor 120 or a power line 161, which are to be described below, through contact holes, for example, a first electrode contact hole CNTD and a second electrode contact hole CNTS, respectively.

Figure 29:
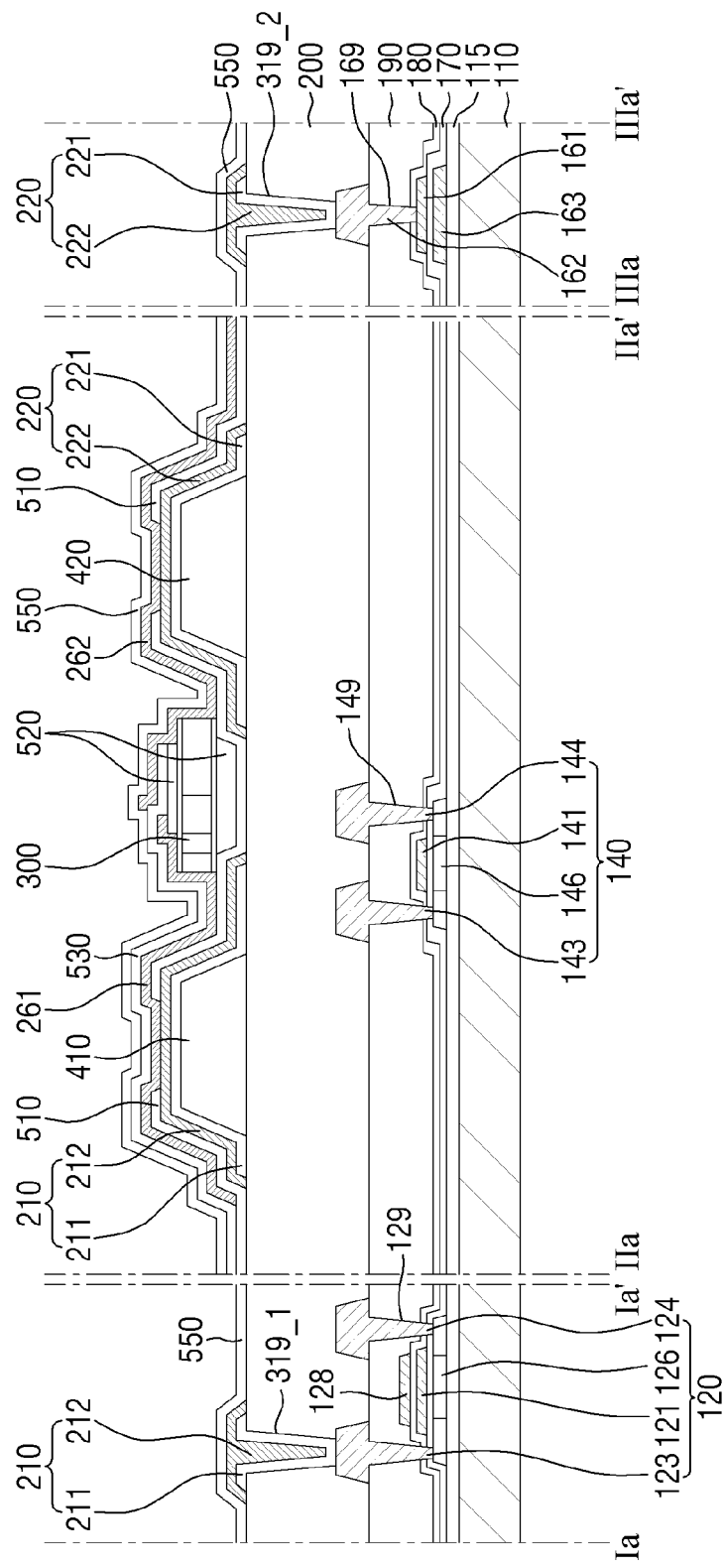
FIG. 29 is a schematic cross-sectional view taken along lines Ia-Ia', IIa-IIa', and IIIa-IIIa' of FIG. 28.

Although not shown in FIG. 28, the display device 10 may include a second insulating layer 520 (see FIG. 29) disposed to overlap at least a portion of each of the electrodes 210 and 220 and the light-emitting element 300, a third insulating layer 530 (see FIG. 29), and a passivation layer 550 (see FIG. 29). The arrangement and structure thereof will be described below with reference to FIG. 29.

FIG. 29 is a schematic cross-sectional view taken along lines Ia-Ia', IIa-IIa', and IIIa-IIIa' of FIG. 28. FIG. 29 illustrates only a pixel PXn, but the structure of the pixel PXn may be applied to other pixels. FIG. 29 illustrates a cross-sectional view traversing an end and another end of an arbitrary light-emitting element 300.

Referring to FIGS. 28 and 29, the display device 10 may include a substrate 110, thin film transistors 120 and 140 disposed on the substrate 110, the electrodes 210 and 220 disposed on the thin film transistors 120 and 140, and the light-emitting element 300. The thin film transistors 120 and 140 may include a first thin film transistor 120 and a second thin film transistor 140, which may be a driving transistor and a switching transistor, respectively.

The substrate 110 may be an insulating substrate. The substrate 110 may be made of an insulating material such as glass, quartz, or a polymer resin. The substrate 110 may be a rigid substrate, or a flexible substrate which is bendable, foldable, and rollable.

A buffer layer 115 may be disposed on the substrate 110. The buffer layer 115 may prevent the diffusion of impurity ions, prevent the permeation of moisture or ambient air, and perform a surface planarization function.

A semiconductor layer may be disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like.

A first gate insulating layer 170 may be disposed on the semiconductor layer. The first gate insulating layer 170 may overlap the semiconductor layer. The first gate insulating layer 170 may function as a gate insulating film of the thin film transistor 120 and 140.

A first conductive layer may be disposed on the first gate insulating layer 170. The first conductive layer may include a first gate electrode 121 disposed on the first active layer 126 of the first thin film transistor 120 with the first gate insulating layer 170 interposed therebetween, a second gate electrode 141 disposed on the second active layer 146 of the thin film transistor 140, and the power line 161 disposed on the auxiliary layer 163.

A second gate insulating layer 180 may be disposed on the first conductive layer. The second gate insulating layer 180 may be an interlayer insulating layer.

A second conductive layer may be disposed on the second gate insulating layer 180. The second conductive layer may include a capacitor electrode 128 disposed on the first gate electrode 121 with the second gate insulating layer 180 interposed therebetween. The capacitor electrode 128 and the first gate electrode 121 may form a storage capacitor. The second conductive layer and the above-described first conductive layer may include a same type of material.

An interlayer insulating layer 190 may be disposed on the second conductive layer. The interlayer insulating layer 190 may be an interlayer insulating film. Furthermore, the interlayer insulating layer 190 may perform a surface planarization function. The interlayer insulating layer 190 may include an organic insulating material.

A third conductive layer may be disposed on the interlayer insulating layer 190. The third conductive layer may include a first drain electrode 123 and a first source electrode 124 of the first thin film transistor 120, and a second drain electrode 143 and a second source electrode 144 of the second thin film transistor 140, and a power electrode 162 disposed on the power line 161.

The first source electrode 124 and the first drain electrode 123 may be electrically connected to the first active layer 126 through first contact holes 129 passing through the interlayer insulating layer 190 and the second gate insulating layer 180. The second source electrode 144 and the second drain electrode 143 may be electrically connected to the second active layer 146 through second contact holes 149 passing through the interlayer insulating layer 190 and the second gate insulating layer 180. The power electrode 162 may be electrically connected to the power line 161 through a third contact hole 169 passing through the interlayer insulating layer 190 and the second gate insulating layer 180.

A via layer 200 may be disposed on the third conductive layer. The via layer 200 may be made of an organic material. A surface of the via layer 200 may be flat.

Banks 410 and 420 may be disposed on the via layer 200. The banks 410 and 420 may be spaced apart from and face each other in each pixel PXn, and the first electrode 210 and the second electrode 220 may be disposed on the banks 410 and 420 spaced apart from each other. However, the number of the banks 410 and 420 is not limited thereto.

FIG. 29 illustrates only a cross-sectional view of a first bank 410 and a second bank 420 among three banks disposed in each pixel PXn of FIG. 28, and the arrangement structure thereof may be equally applied to another first bank 410 not shown in FIG. 29.

The first electrode 210 and the second electrode 220 may include the electrode stem portions 210S and 220S and the electrode branch portions 210B and 220B, respectively. It can be understood that the first electrode branch portion 210B and the second electrode branch portion 220B are disposed on the first bank 410 and the second bank 420 of FIG. 29, respectively.

The banks 410 and 420 may be made of substantially the same material and formed by a process. The banks 410 and 420 may form a single grid pattern. The banks 410 and 420 may include polyimide (PI).

The banks 410 and 420 may have a structure in which at least a portion thereof protrudes from the via layer 200. The banks 410 and 420 may protrude upward from a planar surface on which the light-emitting element 300 is disposed, and at least a portion of the protruding portion(s) may have an inclination. The shape of the protruding banks 410 and 420 is not limited to a particular shape.

Reflective layers 211 and 221 disposed on the banks 410 and 420 may reflect incident light. Light, which travels toward the reflective layers 211 and 221 from the light-emitting element 300, may be reflected and transmitted in an outward direction of the display device 10, for example, in an upward direction of the banks 410 and 420.

The reflective layers 211 and 221 may be disposed on the banks 410 and 420.

A first reflective layer 211 may overlap the first bank 410, and a portion thereof may be electrically connected to the first drain electrode 123 of the first thin film transistor 120 through a fourth contact hole 319_1 passing through the via layer 200. A second reflective layer 221 may overlap the bank 420, and a portion thereof may be electrically connected to the power electrode 162 through a fifth contact hole 319_2 passing through the via layer 200.

The reflective layers 211 and 221 may include a material having high reflectance to reflect light emitted from the light-emitting element 300. As an example, the reflective layers 211 and 221 may include a material such as silver (Ag) or copper (Cu), but the disclosure is not limited thereto.

A first electrode layer 212 and a second electrode layer 222 may be disposed on the first reflective layer 211 and the second reflective layer 221, respectively.

The first electrode layer 212 may be disposed directly on the first reflective layer 211. The first electrode layer 212 and the first reflective layer 211 may have substantially a same pattern. The second electrode layer 222 may be disposed directly on the second reflective layer 221 and may be spaced apart from the first electrode layer 212. The second electrode layer 222 and the second reflective layer 221 may have substantially a same pattern.

The electrode layers 212 and 222 may include a transparent conductive material. As an example, the electrode layers 212 and 222 may include a material such as ITO, IZO, or ITZO, but the disclosure is not limited thereto. In some embodiments, the reflective layers 211 and 221 and the electrode layers 212 and 222 may have a structure in which at least one transparent conductive layer made of ITO, IZO, or ITZO and at least one metal layer made of silver (Ag) or copper (Cu) are stacked. As an example, the reflective layers 211 and 221 and the electrode layers 212 and 222 may have a stacked structure of ITO/Ag/ITO.

The first reflective layer 211 and the first electrode layer 212 disposed on the first bank 410 may form the first electrode 210, and the second reflective layer 221 and the second electrode layer 222 disposed on the second bank 420 may form the second electrode 220. Each of the first electrode layer 212 and the second electrode layer 222 may transmit an electrical signal transmitted from the first thin film transistor 120 or the power electrode 162 to the contact electrodes 261 and 262, respectively.

The first insulating layer 510 partially overlapping the first electrode 210, and the second electrode 220 may be disposed on the first electrode 210 and the second electrode 220. The first insulating layer 510 may be disposed to overlap most of the upper surfaces of the first electrode 210 and the second electrode 220 and may expose portions of the first electrode 210 and the second electrode 220. The first insulating layer 510 may be disposed to overlap a space between the first electrode 210 and the second electrode 220 and also partially overlap opposite side portions of the first electrode 210 and the second electrode 220 opposite to each other.

The light-emitting element 300 may be disposed on the first insulating layer 510. Both side surfaces of the first insulating layer 510 may contact the electrodes 210 and 220, thereby electrically insulating the electrodes 210 and 220 from each other. Accordingly, the first insulating layer 510 may protect an area overlapping each of the electrodes 210 and 220 and may electrically insulate the electrodes 210 and 220 from each other. A first conductivity-type semiconductor 310 and a second conductivity-type semiconductor 320 of the light-emitting element 300 may be prevented from directly contacting other base materials, thereby preventing damage to the light-emitting element 300.

One or more light-emitting elements 300 may be disposed between the first electrode 210 and the second electrode 220. In the drawing, in a cross section, a light-emitting element 300 is illustrated as being disposed between the first electrode 210 and the second electrode 220, but as shown in FIG. 28, it is obvious that the light-emitting elements 300 may be provided.

In the light-emitting element 300, the first conductivity-type semiconductor 310, an element active layer 330, the second conductivity-type semiconductor 320, and an electrode layer 370 may be disposed in a direction horizontal to the via layer 200. In other words, the layers of the light-emitting element 300 may be disposed in a lateral direction horizontal to the via layer 200. However, the disclosure is not limited thereto, and the light-emitting element 300 may be arranged between the first electrode 210 and the second electrode 220 such that the stacking direction is reversed.

The second insulating layer 520 may be disposed to overlap at least a partial area of the light-emitting element 300. The second insulating layer 520 may protect the light-emitting element 300 and affix the light-emitting element 300 between the first electrode 210 and the second electrode 220.

The second insulating layer 520 may be disposed to surround an outer surface of the light-emitting element 300. The second insulating layer 520 may extend in the second direction D2 along the space between the first electrode branch portion 210B and the second electrode branch portion 220B and may have an island shape or a linear shape in a plan view.

A portion of a material of the second insulating layer 520 may be disposed in an area in which a lower surface of the light-emitting element 300 contacts the first insulating layer 510. In manufacturing the display device, the portion of the material may be formed in case that the light-emitting element 300 is aligned on the first insulating layer 510 and the second insulating layer 520 is disposed thereon.

The second insulating layer 520 may expose both side surfaces of the light-emitting element 300. The contact electrodes 261 and 262 to be described below may smoothly contact the side surfaces of both end portions of the light-emitting element 300. However, the disclosure is not limited thereto, and the length of the second insulating layer 520 and the length of the light emitting element 300 may be identical to each other so that both side portions thereof may be aligned with each other.

On the second insulating layer 520, the first contact electrode 261, which is disposed on the first electrode 210 and overlaps at least a portion of the second insulating layer 520, may be disposed, and the second contact electrode 262, which is disposed on the second electrode 220 and overlaps at least a portion of the second insulating layer 520, may be provided.

The first contact electrode 261 and the second contact electrode 262 may be disposed on upper surfaces of the first electrode 210 and the second electrode 220, respectively. The first contact electrode 261 and the second contact electrode 262 may electrically contact the first electrode layer 212 and the second electrode layer 222 in areas in which the first insulating layer 510 is patterned to partially expose the first electrode 210 and the second electrode 220, respectively. The first contact electrode 261 and the second contact electrode 262 may electrically contact the side surfaces of both end portions of the light-emitting element 300, respectively, for example, the first conductivity-type semiconductor 310, and the second conductivity-type semiconductor 320 or the electrode layer 370.

The first and second contact electrodes 261 and 262 may be disposed on the second insulating layer 520 or the third insulating layer 530 to be spaced apart from each other. Accordingly, the first contact electrode 261 and the second contact electrode 262 may receive different powers from the first thin film transistor 120 and the power line 161.

The contact electrodes 261 and 262 may include a conductive material. For example, the contact electrodes 261 and 262 may include ITO, IZO, ITZO, aluminum (Al), or the like. However, the disclosure is not limited thereto.

The third insulating layer 530 may be disposed on the first contact electrode 261 to electrically insulate the first contact electrode 261 and the second contact electrode 262 from each other. The third insulating layer 530 may overlap the first contact electrode 261 and may not overlap a partial area of the light-emitting element 300 such that the light-emitting element 300 may electrically contact the second contact electrode 262.

In some embodiments, the third insulating layer 530 may be omitted from the display device 10. Accordingly, the first contact electrode 261 and the second contact electrode 262 may be disposed substantially coplanar with each other and may be electrically insulated from each other by the passivation layer 550 to be described below.

The passivation layer 550 may be formed on the third insulating layer 530 and the second contact electrode 262 and may protect members disposed on the via layer 200 from an external environment. As described above, in case that the third insulating layer 530 is omitted, the passivation layer 550 may be formed directly on the first and second contact electrodes 261 and 262.

Each of the first insulating layer 510, the second insulating layer 520, the third insulating layer 530, and the passivation layer 550 may include an inorganic insulating material. For example, the first insulating layer 510, the second insulating layer 520, the third insulating layer 530, and the passivation layer 550 may include a material such as silicon oxide ($SiO_x$), silicon nitride ($SiN_x$), silicon oxynitride ($SiO_xN_y$), aluminum oxide ($Al_2O_3$), or aluminum nitride (AlN). The first insulating layer 510, the second insulating layer 520, the third insulating layer 530, and the passivation layer 550 may be made of (or include) the same material or different materials. The disclosure is not limited thereto.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A light-emitting element structure comprising:
at least one light-emitting element which is disposed on a substrate and extends in a direction perpendicular to the substrate;
an auxiliary layer which is disposed on the substrate, exposes at least a portion of an upper surface of the substrate, and surrounds an outer surface of the at least one light-emitting element;
a current spreading layer which is disposed on the auxiliary layer, surrounds an entire side surface and an upper surface of an end portion of the at least one light-emitting element, and electrically contacts the end portion of the at least one light-emitting element;
a first pad which is electrically connected to the end portion of the at least one light-emitting element, disposed on the current spreading layer, and does not overlap the at least one light-emitting element; and
a second pad which is electrically connected to another end portion of the at least one light-emitting element, disposed on the at least a portion of the upper surface of the substrate, and spaced apart from the auxiliary layer, wherein
the first pad entirely surrounds the at least one light-emitting element in plan view,
the second pad entirely surrounds the at least one light-emitting element in plan view, and
the second pad entirely surrounds an outer periphery of the auxiliary layer in plan view.

2. The light-emitting element structure of claim 1, further comprising:
a first area overlapping the at least one light-emitting element; and
a second area,
wherein the auxiliary layer and the current spreading layer are disposed in the first area and at least a portion of the second area.

3. The light-emitting element structure of claim 2, wherein
the auxiliary layer includes an insulating material and is disposed such that the end portion of the at least one light-emitting element is partially exposed, and
the current spreading layer includes a transparent conductive material and entirely surrounds the end portion of the at least one light-emitting element.

4. The light-emitting element structure of claim 3, wherein
the first pad includes a first extension portion and a first electrode line electrically connected to the first extension portion, and
the first electrode line includes two ends electrically connected to different side portions of the first extension portion and is disposed in the second area to surround the first area.

5. The light-emitting element structure of claim 4, wherein the first extension portion has a width greater than a width of the first electrode line.

6. The light-emitting element structure of claim 5, wherein the second pad has a constant width.

7. The light-emitting element structure of claim 2, wherein the at least one light-emitting element includes:
a semiconductor crystal that extends in a direction; and
an insulating film surrounding an outer peripheral surface of the semiconductor crystal.

8. The light-emitting element structure of claim 7, wherein
the semiconductor crystal includes:
a first conductivity-type semiconductor contacting the substrate;
a second conductivity-type semiconductor having a polarity different from a polarity of the first conductivity-type semiconductor;
an element active layer disposed between the first conductivity-type semiconductor and the second conductivity-type semiconductor; and
an electrode layer disposed on the second conductivity-type semiconductor, and
the insulating film is disposed such that an upper surface of the electrode layer is exposed.

9. The light-emitting element structure of claim 8, wherein
the auxiliary layer contacts an outer surface of the insulating film,
the current spreading layer electrically contacts the electrode layer exposed by the insulating film, and
the first pad is electrically connected to the electrode layer through the current spreading layer.

10. The light-emitting element structure of claim 8, wherein
the substrate includes a base substrate and a conductive semiconductor layer disposed on the base substrate,
the first conductivity-type semiconductor electrically contacts the conductive semiconductor layer, and
the second pad is disposed on the conductive semiconductor layer and is electrically connected to the first conductivity-type semiconductor.

11. The light-emitting element structure of claim 2, wherein the at least one light-emitting element includes:
a first light-emitting element; and
a second light-emitting element spaced apart from the first light-emitting element.

12. The light-emitting element structure of claim 11, wherein
the first area includes:
a first sub-area which overlaps the first light-emitting element; and
a second sub-area which overlaps the second light-emitting element and is spaced apart from the first sub-area, and the second area includes:
a third area disposed between the first sub-area and the second sub-area; and
a fourth area disposed at an outer periphery of the first sub-area and the second sub-area.

13. The light-emitting element structure of claim 12, wherein the first pad includes:
a second extension portion disposed in the third area;
a second electrode line disposed in the fourth area; and
at least one connection portion disposed in the third area and electrically connecting the second extension portion and the second electrode line.

14. The light-emitting element structure of claim 13, wherein the second electrode line surrounds the first sub-area and the second sub-area.

15. The light-emitting element structure of claim 13, wherein the at least one connection portion is disposed in the third area.

16. The light-emitting element structure of claim 15, wherein
the at least one connection portion includes:
a first connection portion which extends in a first direction, includes two ends electrically contacting the second electrode line, and includes a central portion overlapping the second extension portion; and
a second connection portion which extends in a second direction different from the first direction, electrically contacts the second electrode line, and includes a central portion overlapping the second extension portion, and
the first connection portion and the second connection portion intersect each other at the second extension portion.

17. A method of manufacturing a light-emitting element structure, the method comprising:
preparing a substrate and at least one light-emitting element which is disposed on the substrate and extends in a direction perpendicular to the substrate;
forming an auxiliary layer surrounding an outer surface of the at least one light-emitting element on the substrate;
forming a current spreading layer disposed on the auxiliary layer, surrounds a side surface and an upper surface of an end portion of the at least one light-emitting element, and electrically contacting the end portion of the at least one light-emitting element;
forming a first pad disposed on the current spreading layer and electrically connected to the end portion of the at least one light-emitting element, the first pad entirely surrounding the at least one light-emitting element in plan view; and
forming a second pad disposed on the substrate and electrically connected to another end portion of the at least one light-emitting element, the second pad entirely surrounding the at least one light-emitting element and entirely surrounding an outer periphery of the auxiliary layer in plan view.

18. The method of claim 17, wherein
the auxiliary layer includes an insulating material and is disposed such that the end portion of the at least one light-emitting element is partially exposed,
the current spreading layer includes a transparent conductive material and surrounds the end portion of the at least one light-emitting element, and
the first pad is electrically connected to the end portion of the at least one light-emitting element through the current spreading layer.

19. The method of claim 18, wherein
the forming of the first pad includes forming an extension portion and an electrode line electrically connected to the extension portion,
the extension portion does not overlap the at least one light-emitting element, and
the electrode line surrounds an area overlapping the at least one light-emitting element.

20. The method of claim 19, wherein
the substrate includes a base substrate and a conductive semiconductor layer disposed on the base substrate, and
the forming of the second pad includes forming the second pad on the conductive semiconductor layer to be electrically connected to the another end portion of the at least one light-emitting element.

21. The light-emitting element structure of claim 1, wherein
the current spreading layer contacts the entire side surface and the upper surface of the end portion of the at least one light-emitting element,
the first pad is spaced apart from the second pad in plan view and
the second pad entirely surrounds the first pad in plan view.

* * * * *